(12) United States Patent
Oh et al.

(10) Patent No.: US 12,368,980 B2
(45) Date of Patent: Jul. 22, 2025

(54) DIGITAL-TO-ANALOG SIGNAL CONVERTER AND IMAGE SENSOR INCLUDING THE SAME

(71) Applicant: Samsung Electronics Co., Ltd., Suwon-si (KR)

(72) Inventors: Myeongjin Oh, Suwon-si (KR); Jaejung Park, Suwon-si (KR); Sukho Shin, Suwon-si (KR); Haneul Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 17/986,966

(22) Filed: Nov. 15, 2022

(65) Prior Publication Data

US 2023/0156372 A1    May 18, 2023

(30) Foreign Application Priority Data

Nov. 15, 2021  (KR) .................. 10-2021-0157105
Jun. 8, 2022   (KR) .................. 10-2022-0069551

(51) Int. Cl.
| | |
|---|---|
| *H04N 25/772* | (2023.01) |
| *H03M 1/76* | (2006.01) |
| *H04N 25/78* | (2023.01) |

(52) U.S. Cl.
CPC ............ *H04N 25/772* (2023.01); *H03M 1/76* (2013.01); *H04N 25/78* (2023.01)

(58) Field of Classification Search
CPC .......... C12Q 1/6886; C12Q 2600/154; H03M 1/123; H03M 1/56; H03M 1/742; H03M 1/76; H04N 25/772; H04N 25/78
See application file for complete search history.

(56) References Cited

U.S. PATENT DOCUMENTS

| | | |
|---|---|---|
| 6,590,516 B2 | 7/2003 | Inagaki et al. |
| 6,809,673 B2 | 10/2004 | Scanlan et al. |

(Continued)

FOREIGN PATENT DOCUMENTS

| | | |
|---|---|---|
| JP | 2003/204266 A | 7/2003 |
| JP | 2003/258641 A | 9/2003 |

(Continued)

OTHER PUBLICATIONS

Office Action from corresponding Taiwanese Application No. 111143557, dated Jul. 30, 2024.

*Primary Examiner* — Amy R Hsu
(74) *Attorney, Agent, or Firm* — Harness, Dickey & Pierce, P.L.C.

(57) ABSTRACT

A digital-to-analog converter includes a first channel configured to output a first ramp voltage through an output node, and a first bias circuit configured to apply a bias voltage to the first channel. The first channel comprises a plurality of current cells connected to the first bias circuit, a plurality of selection circuits and a plurality of switches, and a first resistor connected to the output node. Each of the plurality of selection circuits of the first channel comprises a first selection circuit configured to connect a current of one of the plurality of current cells to the first resistor in accordance with a first digital input signal, and a second selection circuit configured to connect the current of the current cell to one of the plurality of switches corresponding to the current cell in accordance with a second digital input signal complementary to the first digital input signal.

20 Claims, 15 Drawing Sheets

(56) References Cited

U.S. PATENT DOCUMENTS

| | | | |
|---|---|---|---|
| 7,701,373 | B2 | 4/2010 | Tokumaru et al. |
| 7,764,211 | B2 | 7/2010 | Tokumaru et al. |
| 8,390,493 | B1* | 3/2013 | Raghavan ............... H03M 1/00 341/142 |
| 9,166,614 | B2 | 10/2015 | Higuchi et al. |
| 10,469,097 | B1* | 11/2019 | Bothra ............... H03F 3/45183 |
| 2007/0194962 | A1* | 8/2007 | Asayama ............... H04N 25/78 341/144 |
| 2011/0169990 | A1* | 7/2011 | Higuchi .................. H03K 4/48 341/110 |
| 2014/0132814 | A1 | 5/2014 | Ishii et al. |
| 2015/0014516 | A1* | 1/2015 | Asayama ............ H03M 1/1014 341/144 |

FOREIGN PATENT DOCUMENTS

| | | |
|---|---|---|
| JP | 2004/282616 A | 10/2004 |
| TW | 201023537 A | 6/2010 |

* cited by examiner

DIGITAL-TO-ANALOG SIGNAL CONVERTER AND IMAGE SENSOR INCLUDING THE SAME

CROSS-REFERENCE TO RELATED APPLICATIONS

This application claims priority under 35 U.S.C. § 119 to Korean Patent Application No. 10-2021-0157105 filed on Nov. 15, 2021, and Korean Patent Application No. 10-2022-0069551 filed on Jun. 8, 2022, in the Korean Intellectual Property Office, the disclosures of which are incorporated by reference herein in their entireties.

FIELD

Some example embodiments of the inventive concepts relate to a digital-to-analog converter and/or an image sensor including the same, including a digital-to-analog converter including a current cell and/or an image sensor including the same.

BACKGROUND

The digital-to-analog converter may convert a digital input into an analog output such as lamp voltage. As one of various structures of the digital-to-analog converter, a current steering digital-to-analog converter may generate a current with a magnitude corresponding to a value of the digital input and may generate an analog output by outputting a voltage from the generated current. The current steering digital-to-analog converter may include a channel including a plurality of current sources generating currents in accordance with the digital input and may include a plurality of channels. Mismatch between each two of the plurality of channels may deteriorate linearity of the current steering digital-to-analog converter.

SUMMARY

Some example embodiments of the inventive concepts relate to a digital-to-analog converter having high linearity, reducing effect of noise, and providing a short settling time and an image sensor.

According to an aspect of the inventive concepts, a digital-to-analog converter includes a first channel configured to output a first ramp voltage through an output node, and a first bias circuit configured to apply a bias voltage to the first channel. The first channel comprises a plurality of current cells connected to the first bias circuit, a plurality of selection circuits and a plurality of switches, each of the plurality of switches corresponding to a different one of the plurality of current cells, and a first resistor connected to the output node to generate the first ramp voltage in accordance with a current generated by each of the plurality of current cells. Each of the plurality of selection circuits of the first channel comprises a first selection circuit configured to connect a current of one of the plurality of current cells to the first resistor in accordance with a first digital input signal, and a second selection circuit configured to connect the current of the current cell to one of the plurality of switches corresponding to the current cell in accordance with a second digital input signal complementary to the first digital input signal, wherein the one of the plurality of switches is configured to connect the second selection circuit to a reference voltage in accordance with a switching signal.

According to another aspect of the inventive concepts, a digital-to-analog converter includes N channels each configured to generate a ramp voltage, wherein N is a natural number greater than one, and N bias circuits each configured to generate a bias voltage, and to apply the bias voltage to a corresponding channel among the N channels. Each of the N channels comprises a plurality of current cells each connected to a corresponding one of the N bias circuits, a plurality of switch circuits each corresponding to a different one of the plurality of current cells, and a resistor connected to the plurality of switch circuits. Each of the plurality of switch circuits of each of the N channels comprises a first selection switch configured to connect a current of one of the plurality of current cells to the resistor based on a first digital input, and a second selection switch configured to connect the current of the current cell to a reference voltage based on a second digital input complementary to the first digital input. The N bias circuits are connected to one another through a shared node.

According to another aspect of the inventive concepts, an image sensor includes a ramp signal generator configured to generate a ramp voltage, and a comparison circuit configured to receive the ramp voltage as an input. The ramp signal generator comprises a first channel configured to generate a first ramp voltage, a second channel configured to generate a second ramp voltage, a first bias circuit configured to apply a bias voltage to the first channel, and a second bias circuit configured to apply a bias voltage to the second channel. Each of the first channel and the second channel comprises a plurality of current cells connected to a corresponding one of the first bias circuit and the second bias circuit, a plurality of selection circuits and a plurality of switches, each of the plurality of switches corresponding to a different one of the plurality of current cells, and a resistor connected to the plurality of selection circuits. Each of the plurality of selection circuits comprises a first selection circuit configured to connect a current of one of the plurality of current cells to the resistor in accordance with a first digital input signal, and a second selection circuit configured to connect the current of the current cell to one of the plurality of switches corresponding to the current cell in accordance with a second digital input signal complementary to the first digital input signal, wherein the one of the plurality of switches is configured to connect the second selection circuit to a reference voltage in accordance with a switching signal, and wherein the first bias circuit is connected to the second bias circuit through a shared node.

BRIEF DESCRIPTION OF THE DRAWINGS

Some example embodiments will be more clearly understood from the following detailed description taken in conjunction with the accompanying drawings in which.

DETAILED DESCRIPTION

Figure 1:
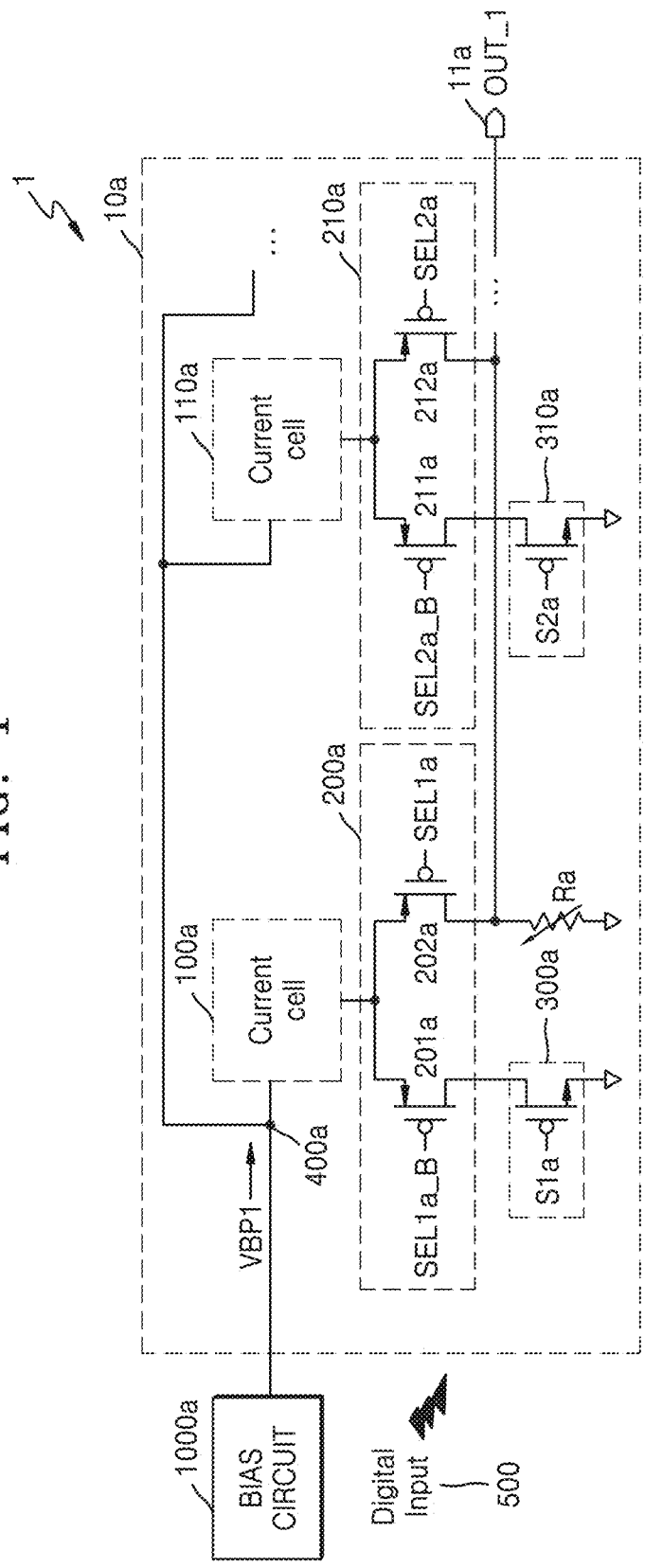
FIG. 1 is a circuit diagram embodying a single channel digital-to-analog converter according to an example embodiment.

FIG. 1 is a circuit diagram illustrating an overall structure of a digital-to-analog converter 1 according to an example embodiment.

Figure 3:
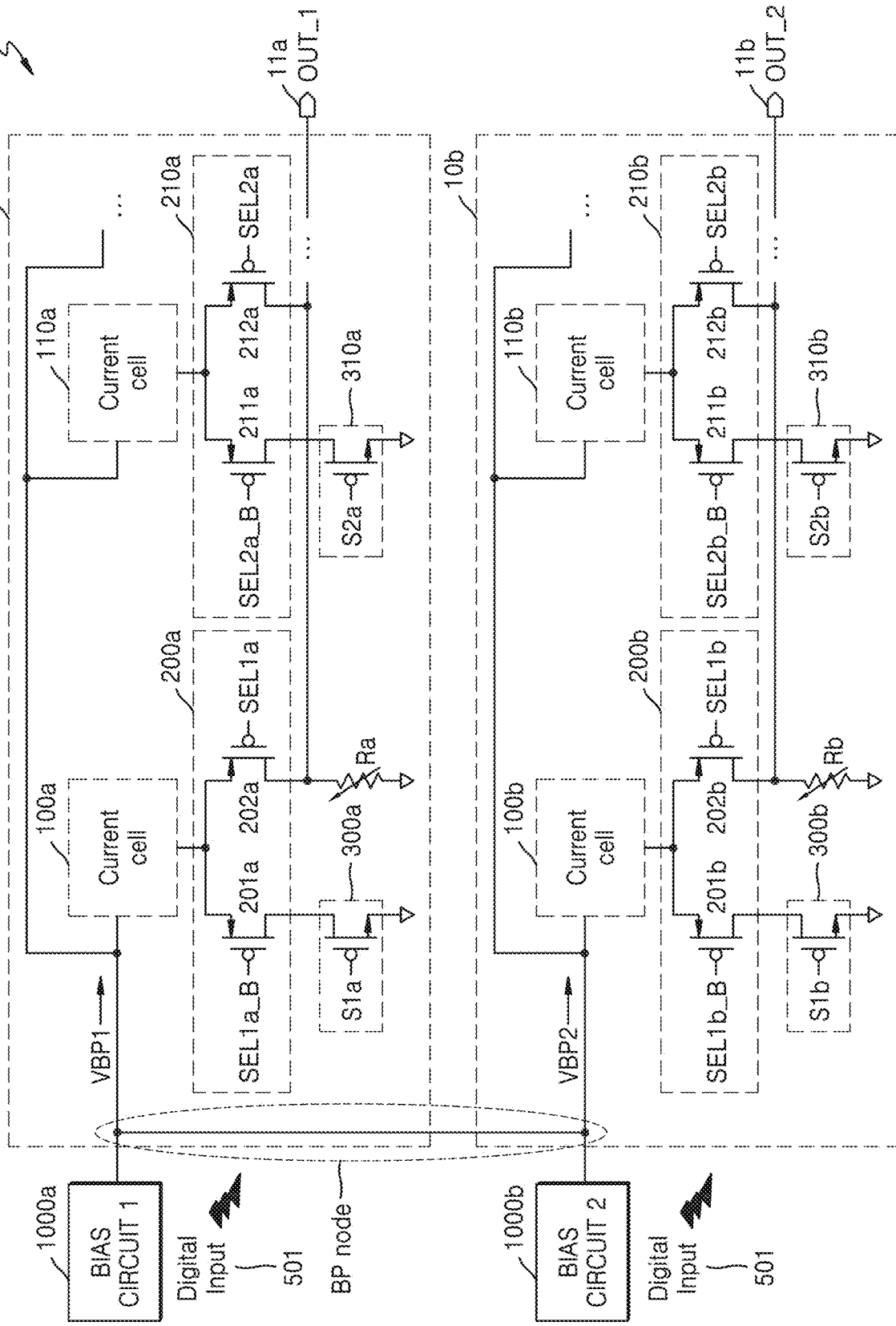
FIG. 3 is a circuit diagram embodying a 2-channel digital-to-analog converter according to an example embodiment.
Figure 7A:
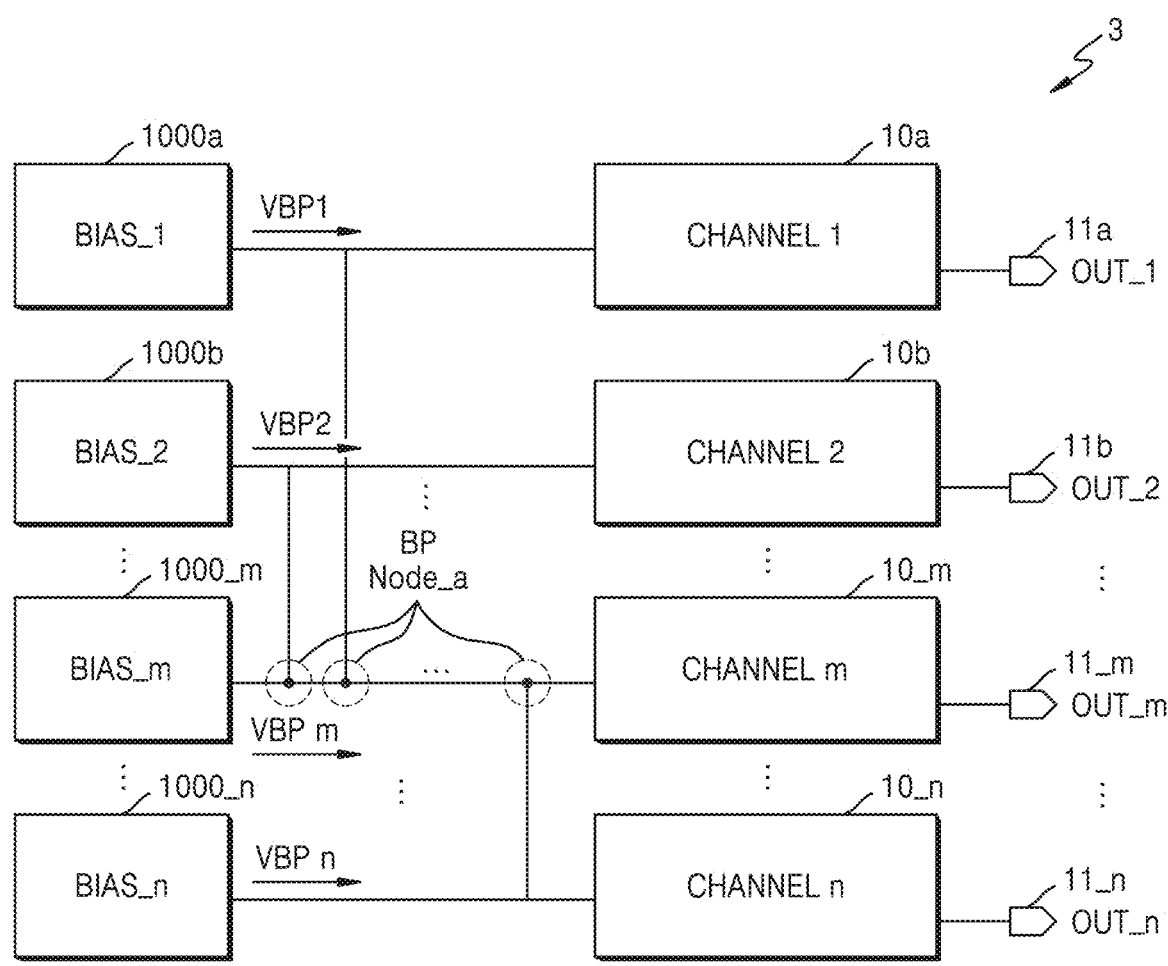
FIG. 7A is a block diagram illustrating an overall structure of a 3-channel or more multi-line digital-to-analog converter according to an example embodiment.

Referring to FIG. 1, the digital-to-analog converter 1 may include a single channel digital-to-analog converter. The digital-to-analog converter 1 may generate a first ramp voltage OUT_1 as an output through a first output node 11a in accordance with first to fourth selection signals SEL1a, SEL1a_B, SEL2a, and SEL2a_B that are digital input signals based on a digital input 500 of K bits (e.g., K is an integer greater than 1). However, the digital-to-analog converter 1 according to the inventive concepts is not limited to the single channel digital-to-analog converter, and may be a 2-channel digital-to-analog converter 2 as illustrated in FIG. 3 or a 3-channel or more multi-line digital-to-analog converter 3 as illustrated in FIG. 7A.

As illustrated in FIG. 1, the digital-to-analog converter 1 may include a first channel 10a and a first bias circuit 1000a, and the first channel 10a may include first and second current cells 100a and 110a, first and second selection circuits 200a and 210a, a resistor Ra, and first and second switches 300a and 310a. The resistor Ra may include a variable resistor.

In some example embodiments, the digital-to-analog converter 1 may be manufactured by a semiconductor process. In some example embodiments, components of the digital-to-analog converter 1 may be included in one die or package. In some example embodiments, the components of the digital-to-analog converter 1 may be included in two or more packages and the digital-to-analog converter 1 may include a printed circuit board (PCB) on which the two or more packages are mounted.

In some example embodiments, as illustrated in FIG. 1, the first channel 10a may include the first and second current cells 100a and 110a each generating a current. The number of first and second current cells 100a and 110a included in the first channel 10a may vary. Each of the first and second current cells 100a and 110a may generate the current based on a first bias voltage VBP1 provided by the first bias circuit 1000a.

The first bias circuit 1000a may apply the first bias voltage VBP1 to the first channel 10a through a bias node 400a, and the first bias voltage VBP1 may be applied to the first and second current cells 100a and 110a. In order to apply the first bias voltage VBP1 to the first channel 10a including the first and second current cells 100a and 110a to generate the current in accordance with the digital input 500, the first bias voltage VBP1 may be generated by the first bias circuit 1000a.

For example, the first bias circuit 1000a may generate at least one first bias voltage VBP1, and the first and second current cells 100a and 110a included in the first channel 10a may commonly receive the at least one first bias voltage VBP1 provided by the first bias circuit 1000a. In some example embodiments, the first bias circuit 1000a may control the first bias voltage VBP1 based on external control, and accordingly, a magnitude of the current generated by each of the first and second current cells 100a and 110a may be controlled.

In some example embodiments, each of the first and second current cells 100a and 110a may generate the current in accordance with the first bias voltage VBP1 applied by the first bias circuit 1000a. The first and second current cells 100a and 110a may be connected to the first and second selection circuits 200a and 210a, respectively. The first and second switches 300a and 310a may be connected to the first and second selection circuits 200a and 210a, respectively. The first and second selection circuits 200a and 210a may be commonly connected to the resistor Ra.

Each of the first and second switches 300a and 310a may be controlled to be in an off state when a current cell corresponding thereto is not used among the first and second current cells 100a and 110a. In addition, each of the first and second switches 300a and 310a may be controlled to be in an on state when a current cell corresponding thereto is used among the first and second current cells 100a and 110a. In some example embodiments, the first and second switches 300a and 310a may operate based on switching signals S1a and S2a in accordance with external control as described below. In addition, as described below, in response to the first to fourth selection signals SEL1a, SEL1a_B, SEL2a, and SEL2a_B, based on the digital input 500, the current generated by the current cell corresponding to each of the first and second switches 300a and 310a may flow through the resistor Ra or a reference voltage (for example, ground).

In some example embodiments, when the first current cell 100a is used, the current may be generated and controlled through the first selection circuit 200a and the first switch 300a corresponding to the first current cell 100a. The first selection circuit 200a may include a first selection transistor 202a and a second selection transistor 201a. The first selection transistor 202a and the second selection transistor 201a included in the first selection circuit 200a connected to the first current cell 100a may be controlled in accordance with the first and second selection signals SEL1a and SEL1a_B that are some of the digital input signals based on the digital input 500.

Specifically, when the first current cell 100a is used, the switching signal S1a having the first switch 300a corresponding to the first current cell 100a be in the on state may be applied. In order to have the current generated by the first current cell 100a flow through the resistor Ra, the first selection signal SEL1a may be applied to the first selection transistor 202a so that the first selection transistor 202a is in an on state. When the first selection transistor 202a is in the on state, the second selection signal SEL1a_B may be applied to the second selection transistor 201a so that the second selection transistor 201a is in an off state. For example, the second selection signal SEL1a_B may be a complementary signal of the first selection signal SEL1a. That is, by controlling the first selection transistor 202a and the second selection transistor 201a to be in the on state and the off state, respectively, the current generated by the first current cell 100a may flow through the resistor Ra.

Alternatively, in order to have the current generated by the first current cell 100a flow to the ground, the first selection signal SEL1a may be applied to the first selection transistor 202a so that the first selection transistor 202a is in an off state. When the first selection transistor 202a is in the off state, the second selection signal SEL1a_B may be applied to the second selection transistor 201a so that the second selection transistor 201a is in the on state. That is, by controlling the first selection transistor 202a and the second selection transistor 201a to be in the off state and the on state, respectively, the current generated by the first current cell 100a may flow to the ground through the second selection transistor 201a and the first switch 300a. As a result, the current generated by the first current cell 100a may be controlled to flow through the resistor Ra or the ground through the first selection circuit 200a and switching of the first switch 300a.

In some example embodiments, when the first current cell 100a is not used, the current may be inhibited or prevented from being generated through the first selection circuit 200a and the first switch 300a corresponding to the first current cell 100a. Specifically, in order to inhibit or prevent the first current cell 100a from generating the current, the switching signal S1a having the first switch 300a be in the off state may be applied and the second selection signal SEL1a_B may be applied to the second selection transistor 201a so that the second selection transistor 201a is the on state. In addition, the first selection signal SEL1a may be applied to the first selection transistor 202a so that the first selection transistor 202a is in the off state. That is, by applying the switching signal S1a so that the first switch 300a is in the off state, connection between the first current cell 100a and the ground may be cut off. As a result, the current may be inhibited or prevented from being generated by the first current cell 100a through the first selection circuit 200a and the switching of the first switch 300a.

In some example embodiments, when the second current cell 110a is used, the current may be generated and controlled through the second selection circuit 210a and the second switch 310a corresponding to the second current cell 110a. The second selection circuit 210a may include a third selection transistor 212a and a fourth selection transistor 211a. The third selection transistor 212a and the fourth selection transistor 211a included in the second selection circuit 210a connected to the second current cell 110a may be controlled in accordance with the third and fourth selection signals SEL2a and SEL2a_B that are some of the digital input signals based on the digital input 500.

Specifically, when the second current cell 110a is used, the switching signal S2a having the second switch 310a corresponding to the second current cell 110a in the on state may be applied. In order to have the current generated by the second current cell 110a flow through the resistor Ra, the third selection signal SEL2a may be applied so that the third selection transistor 212a is in an on state. When the third selection transistor 212a is in the on state, the fourth selection signal SEL2a_B may be applied so that the fourth selection transistor 211a is in an off state. For example, the fourth selection signal SEL2a_B may be a complementary signal of the third selection signal SEL2a. That is, by controlling the third selection transistor 212a and the fourth selection transistor 211a to be in the on state and the off state, respectively, the current generated by the second current cell 110a may flow through the resistor Ra. Alternatively, in order to have the current generated by the second current cell 110a flow to the ground, the third selection signal SEL2a may be applied so that the third selection transistor 212a is in an off state. When the third selection transistor 212a is in the off state, the fourth selection signal SEL2a_B may be applied so that the fourth selection transistor 211a is in an on state. That is, by controlling the third selection transistor 212a and the fourth selection transistor 211a to be in the off state and the on state, respectively, the current generated by the second current cell 110a may flow to the ground through the fourth selection transistor 211a and the second switch 310a. As a result, the current generated by the second current cell 110a may be controlled to flow through the resistor Ra or the ground through the second selection circuit 210a and switching of the second switch 310a.

In some example embodiments, when the second current cell 110a is not used, the current may be inhibited or prevented from being generated through the second selection circuit 210a and the second switch 310a corresponding to the second current cell 110a. Specifically, in order to inhibit or prevent the second current cell 110a from generating the current, the switching signal S2a having the second switch 310a in the off state may be applied and the fourth selection signal SEL2a_B may be applied so that the fourth selection transistor 211a is in the on state. In addition, the third selection signal SEL2a may be applied so that the third selection transistor 212a is in the off state. That is, by applying the switching signal S1a so that the second switch 310a is in the off state, connection between the second current cell 110a and the ground may be cut off. As a result, the current may be inhibited or prevented from being generated by the second current cell 110a through the switching of the second switch 310a.

As a result, through the first and second switches 300a and 310a and the first and second selection circuits 200a and 210a operating in accordance with the first to fourth selection signals SEL1a, SEL1a_B, SEL2a, and SEL2a_B that are the digital input signals based on the digital input 500, it may be determined whether each of the first and second current cells 100a and 110a is used and the current generated by each of the first and second current cells 100a and 110a may be controlled.

Figure 4A:
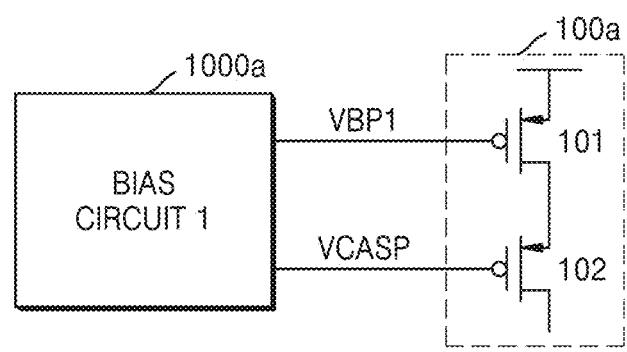
FIGS. 4A and 4B are circuit diagrams illustrating structures of a plurality of current cells according to an example embodiment.

When a current of a current cell in use is to be blocked (or when an unused current cell is to be used), a switch may be used. Specifically, in order to reduce power consumption, when current supply to at least one current cell in use among the first and second current cells 100a and 110a is cut off so that the current cell is not used, a vertical blank section may occur. In some example embodiments, as described above, the current may be blocked by having the switch corresponding to the current cell in use in an off state. That is, in a state in which the first bias voltage VBP1 provided by the first bias circuit 1000a and/or a cascode voltage VCASP to be described below with reference to FIG. 4A are/is applied through each node, because the current may be blocked through switching of the switch, the effect of noise and a settling time may be reduced, compared to directly switching each node.

In addition, the current generated by each of the first and second current cells 100a and 110a may be controlled to flow through the resistor Ra or the reference voltage (for example, the ground). Therefore, the magnitude of the current flowing from the first channel 10a to the resistor Ra may be controlled so that a magnitude of the first ramp voltage OUT_1 output through the first output node 11a may be controlled.

In addition, in a comparative example in which the bias node 400a connecting the first bias circuit 1000a to the first channel 10a is directly switched in order to control current generation of each of the current cells, it may be requested to charge a capacitor in order to settle the first bias circuit 1000a against a rapid voltage change while switching the bias node 400a. On the other hand, according to the inventive concepts, because the current generation is controlled by switching the first and second switches 300a and 310a connected to the ground in a state in which the bias node 400a connecting the first bias circuit 1000a to the first channel 10a is connected, a charging state of the capacitor may be maintained. Therefore, a circuit settling time in accordance with a change in on or off state of the switch may be remarkably reduced.

It is apparent that the operation process and effect of the single channel digital-to-analog converter 1 may also be applied to a 2-channel or more multi-line digital-to-analog converter.

Figure 2:
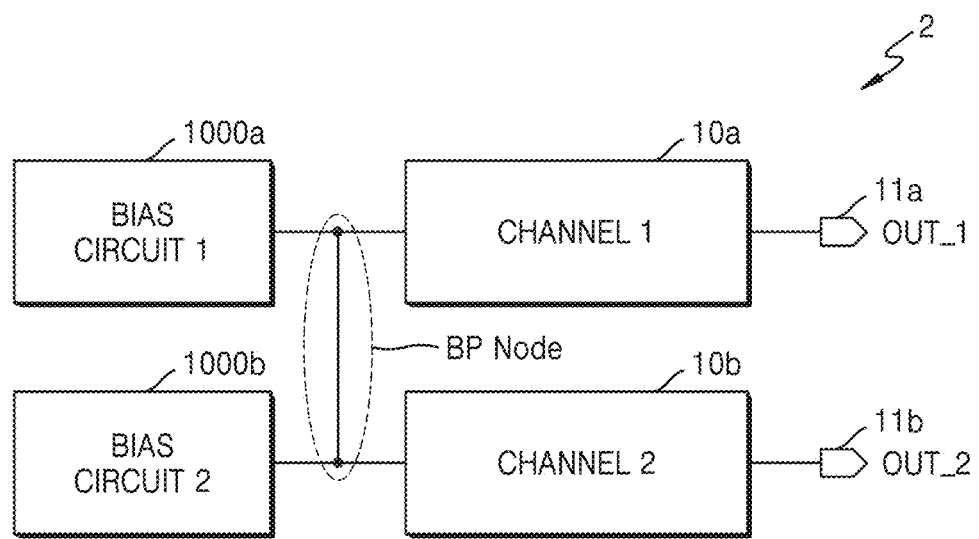
FIG. 2 is a block diagram illustrating an overall structure of a 2-channel digital-to-analog converter according to an example embodiment.

FIG. 2 is a block diagram illustrating an overall structure of a 2-channel digital-to-analog converter 2 according to an embodiment. As illustrated in FIG. 2, the 2-channel digital-to-analog converter 2 may further include a second bias circuit 1000b and a second channel 10b in addition to the first bias circuit 1000a and the first channel 10a described with reference to FIG. 1. The second channel 10b may receive a second bias voltage from the second bias circuit 1000b and may output a second ramp voltage OUT_2 through a second output node 11b. Description of the operations of the first bias circuit 1000a and the first channel 10a in FIG. 1 may be similarly given to operations of the second bias circuit 1000b and the second channel 10b.

In some example embodiments, the first bias node (for example, 400a of FIG. 1) to which the first bias circuit 1000a outputs the first ramp voltage OUT1 may be connected to a second bias node to which the second bias circuit 1000b outputs the second ramp voltage OUT_2 by a shared node BP Node. Specific configurations and operations of the first channel 10a and the second channel 10b are described below with reference to FIG. 3.

FIG. 3 is a circuit diagram embodying the 2-channel digital-to-analog converter 2 according to an example embodiment.

Referring to FIG. 3, the 2-channel digital-to-analog converter 2 may include a first bias circuit 1000a, a second bias circuit 1000b, a first channel 10a, and a second channel 10b. The second channel 10b may include third and fourth current cells 100b and 110b, third and fourth selection circuits 200b and 210b, a resistor Rb, and third and fourth switches 300b and 310b. The resistor Rb may include a variable resistor. The 2-channel digital-to-analog converter 2 may generate a first ramp voltage OUT_1 and a second ramp voltage OUT_2 as outputs through a first output node 11a and a second node 11b in accordance with first to eighth selection signals SEL1a, SEL1a_B, SEL2a, SEL2a_B, SEL1b, SEL1b_B, SEL2b, and SEL2b_B that are digital input signals based on K bit-inputs 501 (e.g., K is an integer greater than 1). Description of the first bias circuit 1000a and the first channel 10a in FIG. 1 may also apply to the first bias circuit 1000a and the first channel 10a.

In some example embodiments, the second channel 10b may include third and fourth current cells 100b and 110b each generating a current. The number of third and fourth current cells 100b and 110b included in the second channel 10b may vary. Each of the third and fourth current cells 100b and 110b may generate the current based on a second bias voltage VBP2 provided by the second bias circuit 1000b.

The second bias circuit 1000b may apply the second bias voltage VBP2 to the second channel 10b through a shared node BP Node, and the second bias voltage VBP2 may be applied to the third and fourth current cells 100b and 110b. In order to apply the second bias voltage VBP2 to the second channel 10b including the third and fourth current cells 100b and 110b to generate the current in accordance with the K bit-inputs 501, the second bias voltage VBP2 may be generated by the second bias circuit 1000b.

For example, the second bias circuit 1000b may generate at least one second bias voltage VBP2, and the third and fourth current cells 100b and 110b included in the second channel 10b may commonly receive the at least one second bias voltage VBP2 provided by the second bias circuit 1000b. In some example embodiments, the second bias circuit 1000b may control the second bias voltage VBP2 based on external control, and accordingly, a magnitude of the current generated by each of the third and fourth current cells 100b and 110b may be controlled.

In some example embodiments, each of the third and fourth current cells 100b and 110b may generate the current in accordance with the second bias voltage VBP2 applied by the second bias circuit 1000b. The third and fourth current cells 100b and 110b may be connected to the third and fourth selection circuits 200b and 210b, respectively. The third and fourth switches 300b and 310b may be connected to the third and fourth selection circuits 200b and 210b, respectively. The third and fourth selection circuits 200b and 210b may be commonly connected to the resistor Rb.

Each of the third and fourth switches 300b and 310b may be controlled to be in an off state when a current cell corresponding thereto is not used among the third and fourth current cells 100b and 110b. In addition, each of the third and fourth switches 300b and 310b may be controlled to be in an on state when a current cell corresponding thereto is used among the third and fourth current cells 100b and 110b. In some example embodiments, the third and fourth switches 300b and 310b may operate based on switching signals S1b and S2b in accordance with external control as described below. In addition, as described below, in response to the fifth to eighth selection signals SEL1b, SEL1b_B, SEL2b, and SEL2b_B, based on the K bit-inputs 501, the current generated by the current cell corresponding to each of the third and fourth switches 300b and 310b may flow through the resistor Rb or a reference voltage (for example, ground).

In some example embodiments, when the third current cell 100b is used, the current may be generated and controlled through the third selection circuit 200b and the third switch 300b corresponding to the third current cell 100b. The third selection circuit 200b may include a fifth selection transistor 202b and a sixth selection transistor 201b. The fifth selection transistor 202b and the sixth selection transistor 201b included in the third selection circuit 200b connected to the third current cell 100b may be controlled in accordance with the fifth and sixth selection signals SEL1b and SEL1b_B that are some of the digital input signals based on the K bit-inputs 501.

Specifically, when the third current cell 100*b* is used, the switching signal S1*b* having the third switch 300*b* corresponding to the third current cell 100*b* be in the on state may be applied. In order to have the current generated by the third current cell 100*b* flow through the resistor Rb, the fifth selection signal SEL1*b* may be applied so that the fifth selection transistor 202*b* is in an on state. When the fifth selection transistor 202*b* is in the on state, the sixth selection signal SEL1*b*_B may be applied so that the sixth selection transistor 201*b* is in an off state. For example, the sixth selection signal SEL1*b*_B may be a complementary signal of the fifth selection signal SEL1*b*. That is, by controlling the fifth selection transistor 202*b* and the sixth selection transistor 201*b* to be in the on state and the off state, respectively, the current generated by the third current cell 100*b* may flow through the resistor Rb.

Alternatively, in order to have the current generated by the third current cell 100*b* flow to the ground, the fifth selection signal SEL1*b* may be applied so that the fifth selection transistor 202*b* is in an off state. When the fifth selection transistor 202*b* is in the off state, the sixth selection signal SEL1*b*_B may be applied so that the sixth selection transistor 201*b* is in an on state. That is, by controlling the fifth selection transistor 202*b* and the sixth selection transistor 201*b* to be in the off state and the on state, respectively, the current generated by the third current cell 100*b* may flow to the ground through the sixth selection transistor 201*b* and the third switch 300*b*. As a result, the current generated by the third current cell 100*b* may be controlled to flow through the resistor Rb or the ground through the third selection circuit 200*b* and switching of the third switch 300*b*.

In some example embodiments, when the third current cell 100*b* is not used, the current may be inhibited or prevented from being generated through the third selection circuit 200*b* and the third switch 300*b* corresponding to the third current cell 100*b*. Specifically, in order to inhibit or prevent the third current cell 100*b* from generating the current, the switching signal S1*b* having the third switch 300*b* in the off state may be applied and the sixth selection signal SEL1*b*_B may be applied so that the sixth selection transistor 201*b* is the on state. In addition, the fifth selection signal SEL1*b* may be applied so that the fifth selection transistor 202*b* is in the off state. That is, by applying the switching signal S1*b* so that the third switch 300*b* is in the off state, connection between the third current cell 100*b* and the ground may be cut off. As a result, the current may be inhibited or prevented from being generated by the third current cell 100*b* through the third selection circuit 200*b* and the switching of the third switch 300*b*.

In some example embodiments, when the fourth current cell 110*b* is used, the current may be generated and controlled through the fourth selection circuit 210*b* and the fourth switch 310*b* corresponding to the fourth current cell 110*b*. The fourth selection circuit 210*b* may include a seventh selection transistor 212*b* and an eighth selection transistor 211*b*. The seventh selection transistor 212*b* and the eighth selection transistor 211*b* included in the fourth selection circuit 210*b* connected to the fourth current cell 110*b* may be controlled in accordance with the seventh and eighth selection signals SEL2*b* and SEL2*b*_B that are some of the digital input signals based on the K bit-inputs 501.

Specifically, when the fourth current cell 110*b* is used, the switching signal S2*b* having the fourth switch 310*b* corresponding to the fourth current cell 110*b* be in the on state may be applied. In order to have the current generated by the fourth current cell 110*b* flow through the resistor Rb, the seventh selection signal SEL2*b* may be applied so that the seventh selection transistor 212*b* is in an on state. When the seventh selection transistor 212*b* is in the on state, the eighth selection signal SEL2*b*_B may be applied so that the eighth selection transistor 211*b* is in an off state. For example, the eighth selection signal SEL2*b*_B may be a complementary signal of the seventh selection signal SEL2*b*. That is, by controlling the seventh selection transistor 212*b* and the eighth selection transistor 211*b* to be in the on state and the off state, respectively, the current generated by the fourth current cell 110*b* may flow through the resistor Rb. Alternatively, in order to have the current generated by the fourth current cell 110*b* flow to the ground, the seventh selection signal SEL2*b* may be applied so that the seventh selection transistor 212*b* is in an off state. When the seventh selection transistor 212*b* is in the off state, the eighth selection signal SEL2*b*_B may be applied so that the eighth selection transistor 211*b* is in an on state. That is, by controlling the seventh selection transistor 212*b* and the eighth selection transistor 212*b* to be in the off state and the on state, respectively, the current generated by the fourth current cell 110*b* may flow to the ground through the eighth selection transistor 211*b* and the fourth switch 310*b*. As a result, the current generated by the fourth current cell 110*b* may be controlled to flow through the resistor Rb or the ground through the fourth selection circuit 210*b* and switching of the fourth switch 310*b*.

In some example embodiments, when the fourth current cell 110*b* is not used, the current may be inhibited or prevented from being generated through the fourth selection circuit 210*b* and the fourth switch 310*b* corresponding to the fourth current cell 110*b*. Specifically, in order to inhibit or prevent the fourth current cell 110*b* from generating the current, the switching signal S2*b* having the fourth switch 310*b* in the off state may be applied and the eighth selection signal SEL2*b*_B may be applied so that the eighth selection transistor 211*b* is the on state. In addition, the seventh selection signal SEL2*b* may be applied so that the seventh selection transistor 212*b* is in the off state. That is, by applying the switching signal S1*b* so that the fourth switch 310*b* is in the off state, connection between the fourth current cell 110*b* and the ground may be cut off. As a result, the fourth current cell 110*b* may be inhibited or prevented from generating the current through the switching of the fourth switch 310*b*.

As a result, through the first to fourth switches 300*a*, 310*a*, 300*b*, and 310*b* and the first to fourth selection circuits 200*a*, 210*a*, 200*b*, and 210*b* operating in accordance with the first to eighth selection signals SEL1*a*, SEL1*a*_B, SEL2*a*, SEL2*a*_B, SEL1*b*, SEL1*b*_B, SEL2*b*, and SEL2*b*_B that are the digital input signals based on the K bit-inputs 501, it may be determined whether each of the first to fourth current cells 100*a*, 110*a*, 100*b*, and 110*b* is used and the current generated by each of the first to fourth current cells 100*a*, 110*a*, 100*b*, and 110*b* may be controlled.

When a current of a current cell in use is to be blocked (or when an unused current cell is to be used), a switch may be used. Specifically, in order to reduce power consumption, when supply of a current to at least one current cell in use among the first to fourth current cells 100*a*, 110*a*, 100*b*, and 110*b* is cut off so that the current cell is not used, a vertical blank section may occur. In some example embodiments, as described above, the current may be blocked by having the switch corresponding to the current cell in use in an off state. That is, in a state in which the first bias voltage VBP1 and the second bias voltage VBP2 provided by the first bias circuit 1000*a* and the second bias circuit 1000*b* and/or the cascode voltage VCASP to be described below with reference to FIG. 4A are/is applied through each node, because the current may be blocked through switching of the switch, the effect of noise and a settling time may be reduced, compared to directly switching each node.

In addition, the current generated by each of the first to fourth current cells 100a, 110a, 100b, and 110b may be controlled to flow through the resistor Ra, the resistor Rb, or the reference voltage (for example, the ground). Therefore, the magnitudes of the currents flowing from the first channel 10a and the second channel 10b to the resistor Ra and the resistor Rb may be controlled so that magnitudes of the first ramp voltage OUT_1 and the second ramp voltage OUT_2 output through the first output node 11a and the second output node 11b may be controlled.

In addition, in a comparative example in which the shared node BP Node connecting the first bias circuit 1000a and the second bias circuit 1000b to the first channel 10a and the second channel 10b is directly switched in order to control current generation of each of the current cells, it may be requested to charge a capacitor in order to settle the first bias circuit 1000a and the second bias circuit 1000b against a rapid voltage change while switching the shared node BP Node. On the other hand, according to the inventive concept, because the current generation is controlled by switching the first to fourth switches 300a, 310a, 300b, and 310b connected to the ground in a state in which the shared node BP Node connecting the first bias circuit 1000a and the second bias circuit 1000b to the first channel 10a and the second channel 10b is connected, a charging state of the capacitor may be maintained. Therefore, a circuit settling time in accordance with a change in on or off state of the switch may be remarkably reduced.

As illustrated in FIGS. 2 and 3, in some example embodiments, the first bias circuit 1000a may be connected to the second bias circuit 1000b through the shared node BP Node, and the first bias voltage VBP1 and the second bias voltage VBP2 of the same or substantially the same magnitude may be provided to the first channel 10a and the second channel 10b, respectively. Therefore, high linearity may be provided.

Specifically, the 2-channel digital-to-analog converter 2 according to the inventive concepts may include the shared node BP Node to inhibit or prevent mismatch from occurring between the first channel 10a and the second channel 10b and to reduce deterioration of differential non-linearity (DNL). In addition, the first bias circuit 1000a and the second bias circuit 1000b are separately included so that the first bias voltage VBP1 and the second bias voltage VBP2 are provided to the first channel 10a and the second channel 10b through the shared node BP Node. Therefore, it is possible to reduce the effect of coupling between the first channel 10a and the second channel 10b, which occurs when a bias circuit is shared, and to remarkably reduce deterioration of integral non-linearity (INL).

Figure 4B:
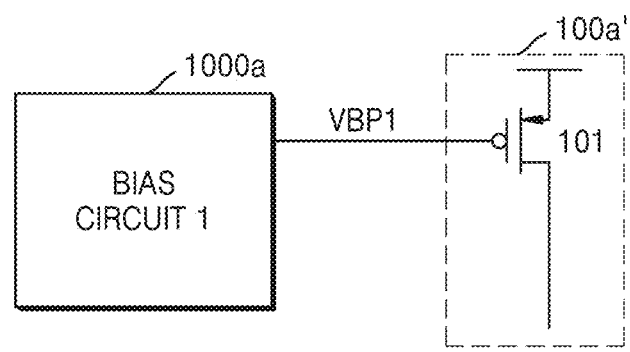

FIGS. 4A and 4B are circuit diagrams illustrating structures of first to fourth current cells 100a, 110a, 100b, and 110b according to an example embodiment. FIG. 4A is a circuit diagram specifically illustrating a current cell 100a having a cascode structure according to an example embodiment. FIG. 4B is a circuit diagram specifically illustrating a current cell 100a' having a single transistor structure according to an example embodiment.

Referring to FIGS. 4A and 4B, the current cell 100a may include a first transistor 101 and a second transistor 102. The first transistor 101 may be connected to a first bias circuit 1000a to receive a first bias voltage VBP1. The second transistor 102 may be connected to the first bias circuit 1000a to receive a cascode voltage VCASP. The second transistor 102 is additionally arranged, and the cascode voltage VCASP is applied to the second transistor 102, wherein the cascode voltage VCASP is different from the first bias voltage VBP1. Therefore, input impedance may be increased so that a high voltage gain may be obtained. In other words, a high gain amplification effect may be obtained through the cascode structure.

Compared to the current cell 100a, the current cell 100a' may include a first transistor 101. The first transistor 101 may be connected to a first bias circuit 1000a to receive a first bias voltage VBP1.

The first transistors 101 and the second transistor 102 of the current cells 100a and 100a' illustrated in FIGS. 4A and 4B are not limited to p-channel metal oxide semiconductor (PMOS) transistors and may include n-channel metal oxide semiconductor (NMOS) transistors. Hereinafter, description of operations of the plurality of current cells 100a, 110a, 100b, and 110b is given based on the PMOS transistors.

Figure 4C:
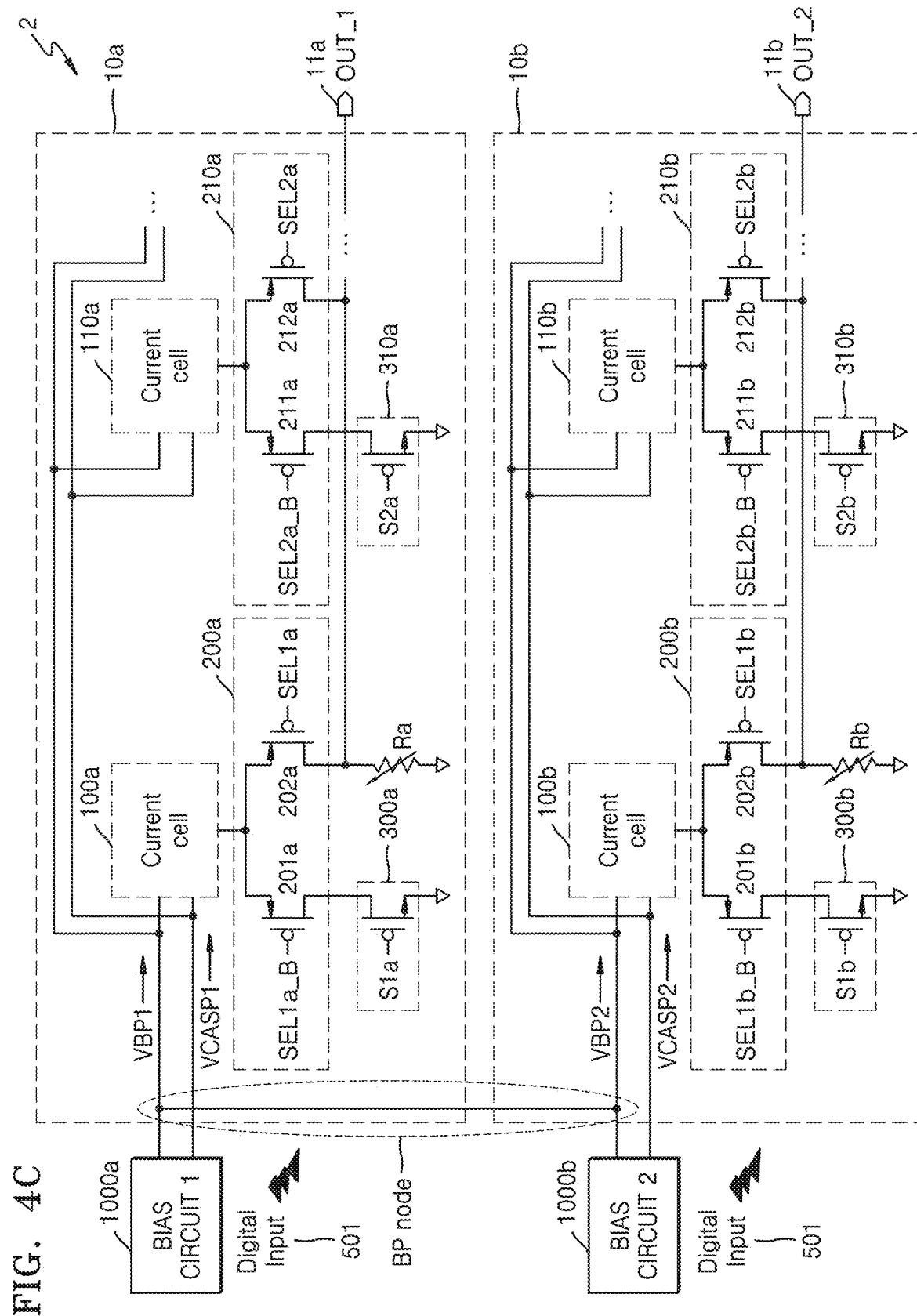
FIG. 4C is a circuit diagram embodying a 2-channel digital-to-analog converter in accordance with the structures of the plurality of current cells of FIG. 4A.

FIG. 4C is a circuit diagram embodying a 2-channel digital-to-analog converter 2 in accordance with the structures of the plurality of current cells 100a, 110a, 100b, and 110b of FIG. 4A.

Referring to FIGS. 3, 4A, and 4C, as described above, the plurality of current cells 100a, 110a, 100b, and 110b of the 2-channel digital-to-analog converter 2 may have cascode structures. In embodiments, the first bias circuit 1000a may be connected to the second bias circuit 1000b through the shared node BP Node. However, a cascode voltage VCASP1 received by the second transistor (for example, 102 of FIG. 4A) of each of the plurality of current cells 100a and 110a of the first channel 10a and a cascode voltage VCASP2 received by a second transistor of each of the plurality of current cells 100b and 110b of the second channel 10b may be respectively applied without an additional shared node.

Figure 5:
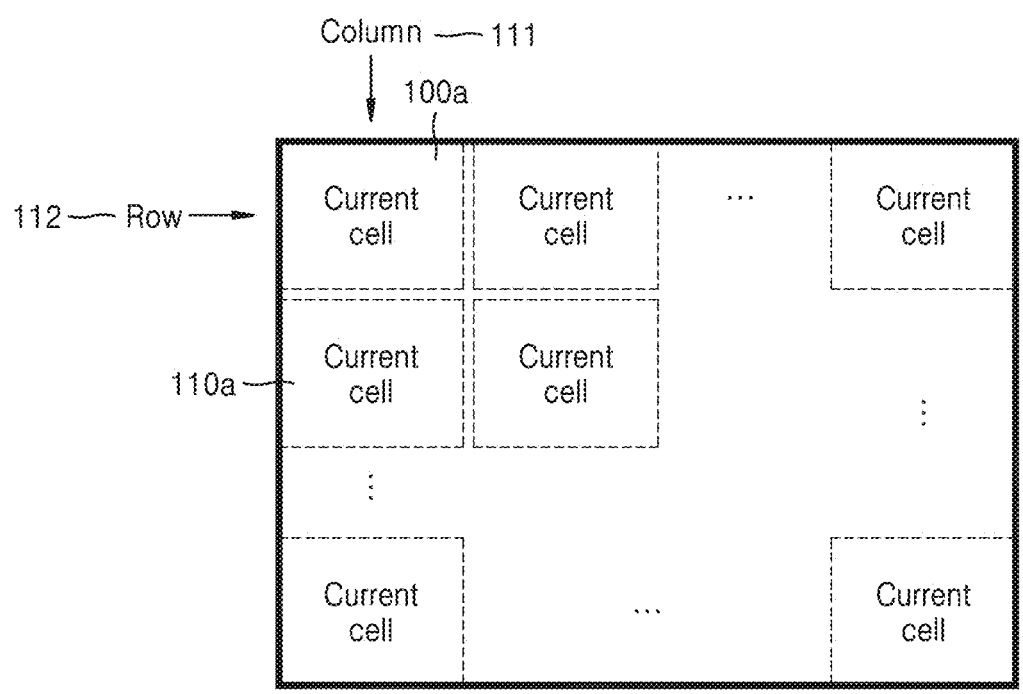
FIG. 5 is a plan view illustrating an arrangement structure of the first to fourth current cells of the 2-channel digital-to-analog converter of FIG. 3 according to an example embodiment.

FIG. 5 is a plan view illustrating an arrangement structure of the first to fourth current cells 100a, 110a, 100b, and 110b of the 2-channel digital-to-analog converter 2 of FIG. 3 according to an example embodiment.

Referring to FIGS. 3 and 5, the first to fourth current cells 100a, 110a, 100b, and 110b may be arranged in a plurality of rows 112 and a plurality of columns 111. In some example embodiments, the first to fourth selection circuits 200a, 210a, 200b, and 210b and the first to fourth switches 300a, 310a, 300b, and 310b respectively corresponding to the first to fourth current cells 100a, 110a, 100b, and 110b may be arranged in a plurality of rows and a plurality of columns in the same or substantially the same method as the first to fourth current cells 100a, 110a, 100b, and 110b. However, an arrangement form of the first to fourth selection circuits 200a, 210a, 200b, and 210b and the first to fourth switches 300a, 310a, 300b, and 310b is not limited thereto. That is, the first to fourth selection circuits 200a, 210a, 200b, and 210b and the first to fourth switches 300a, 310a, 300b, and 310b may be positioned outside a matrix having a plurality of rows and a plurality of columns unlike the first to fourth current cells 100a, 110a, 100b, and 110b.

The current generation of each of the first to fourth current cells 100a, 110a, 100b, and 110b arranged in the plurality of rows 112 and the plurality of columns 111 may be controlled by a row signal for controlling each of the plurality of rows 112 and a column signal for controlling each of the plurality of columns 111.

For example, each of the first to fourth current cells 100a, 110a, 100b, and 110b may include a latch circuit receiving the column signal and the row signal. However, the inventive concepts are not limited thereto, and the latch circuit may be positioned outside the first to fourth current cells 100a, 110a, 100b, and 110b. When a clock signal in accordance with the digital input is applied, logic in the latch circuit may work in accordance with the clock signal.

For example, the column signal and the row signal may be applied to the latch circuit so that the first current cell 100a of the first channel 10a generates a current. The latch circuit may control the first selection circuit 200a through the column signal and the row signal by using the logic therein in accordance with the clock. Accordingly, the current generation of the first current cell 100a may be controlled by determining which one of the first selection transistor 202a and the second selection transistor 201a of the first selection circuit 200a is to be in an on state.

In an example embodiment, in controlling the current generation of each of the first to fourth current cells 100a, 110a, 100b, and 110b, when a signal in units of columns 111 is applied, the current generation of each of the first to fourth current cells 100a, 110a, 100b, and 110b may be controlled by sequentially applying a signal in units of rows 112 (e.g., by applying a signal in the order of the first current cell 100a in a first row and the second current cell 110a in a second row).

In the 2-channel or more multi-line digital-to-analog converter, the current generation of each of the first to fourth current cells 100a, 110a, 100b, and 110b may be controlled by arranging the first to fourth current cells 100a, 110a, 100b, and 110b in a plurality of rows and a plurality of columns.

Figure 6A:
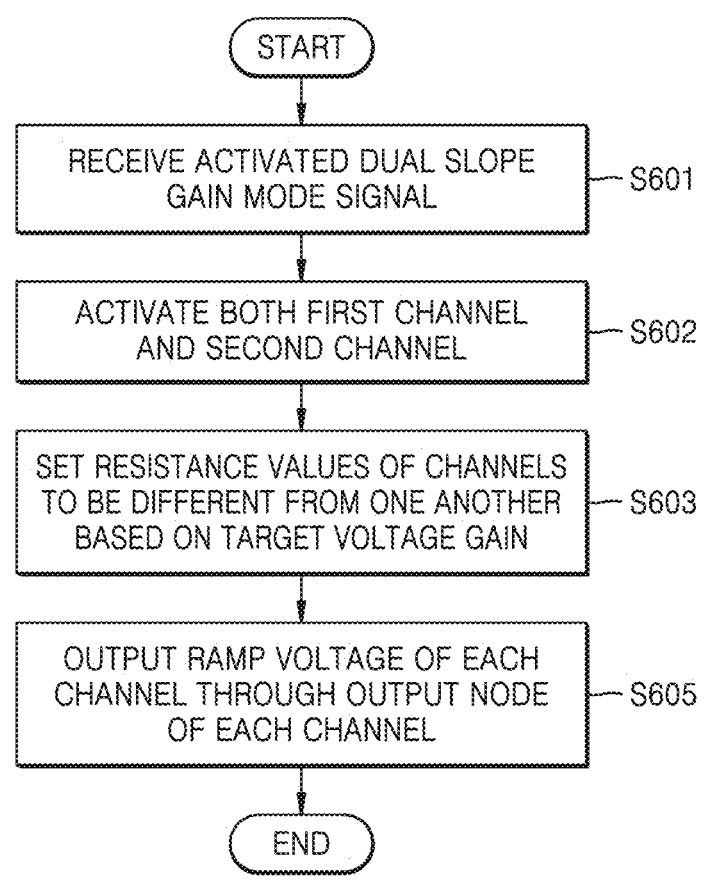
FIG. 6A is a flowchart illustrating an output process when a dual slope gain mode is activated according to example embodiments.
Figure 6B:
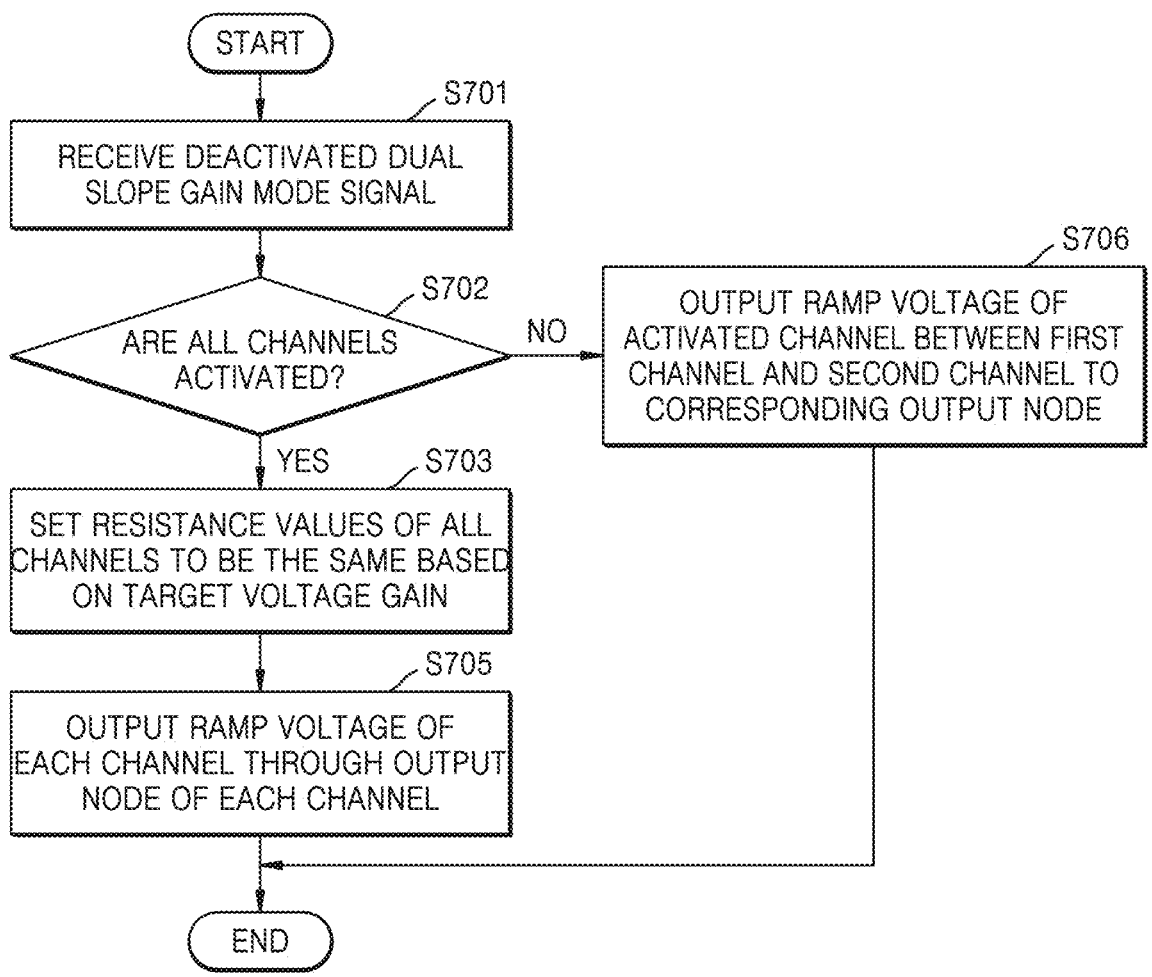
FIG. 6B is a flowchart illustrating an output process when a dual slope gain mode is deactivated according to example embodiments.

FIGS. 6A and 6B are flowcharts illustrating output processes when a dual slope gain mode is activated and when a dual slope gain mode is deactivated according to some example embodiments.

Referring to FIG. 2, as described above, the 2-channel digital-to-analog converter 2 may output the first ramp voltage OUT_1 from the first channel 10a and may output the second ramp voltage OUT_2 from the second channel 10b. In an example embodiment, the resistor Ra of the first channel 10a and the resistor Rb of the second channel 10b may include variable resistors.

In an example embodiment, the 2-channel digital-to-analog converter 2 may activate or deactivate the dual slope gain mode based on an activated or deactivated dual slope gain mode signal, that is, an enable signal (e.g., DSG_en of FIG. 8) or a disable signal (e.g., DSG_dis of FIG. 8) provided from the outside. However, the inventive concepts are not limited thereto. The enable signal DSG_en or the disable signal DSG_dis is not only provided from the outside. The enable signal DSG_en or the disable signal DSG_dis activating or deactivating the dual slope gain mode may be provided by the 2-channel digital-to-analog converter 2.

Referring to FIGS. 2 and 6A, in an example embodiment, the 2-channel digital-to-analog converter 2 may receive the enable signal DSG_en in operation S601. In some example embodiments, in operation S602, the 2-channel digital-to-analog converter 2 may have at least one of the first and second switches 300a and 310a of the first channel 10a be in an on state. In some example embodiments, a current generated by at least one current cell corresponding to the switch in the on state among the first and second current cells 100a and 110a may flow through the resistor Ra. Accordingly, the first ramp voltage OUT_1 may be generated by the first output node 11a. When the 2-channel digital-to-analog converter 2 receives the enable signal DSG_en, the 2-channel digital-to-analog converter 2 may have at least one of the third and fourth switches 300b and 310b of the second channel 10b be in an on state. In some example embodiments, a current generated by at least one current cell corresponding to the switch in the on state among the third and fourth current cells 100b and 110b may flow through the resistor Rb. Accordingly, the second ramp voltage OUT_2 may be generated by the second output node 11b. That is, in operation S602, both the first channel 10a and the second channel 10b may be activated in accordance with the enable signal DSG_en. When the enable signal DSG_en is received in a state in which both the first channel 10a and the second channel 10b are activated, operation S602 may be omitted, which may also be applied to activation of the dual slope gain mode described hereinafter.

In operation S603, based on a target voltage gain to be obtained through the dual slope gain mode, a resistance value of the resistor Ra of the first channel 10a may be set to be different from that of the resistor Rb of the second channel 10b. In operation S605, the first ramp voltage OUT_1 may be output through the first output node 11a of the first channel 10a and the second ramp voltage OUT_2 may be output through the second output node 11b of the second channel 10b. As a result, although the same or substantially the same bias voltage VBP1 or VBP2 is applied to each of the first channel 10a and the second channel 10b through the shared node BP Node, a magnitude of the first ramp voltage OUT_1 generated by the first channel 10a may be controlled to be different from that of the second ramp voltage OUT_2 generated by the second channel 10b. That is, the dual slope gain mode in which different voltage gains may be obtained by the first channel 10a and the second channel 10b may be activated. The first and second ramp voltages OUT_1 and OUT_2 having different voltage gains may be used separately.

However, the order in which the dual slope gain mode is activated is not limited to that of the current embodiment. When an example embodiment may be implemented differently, the dual slope gain mode may be activated in the order different from the described one. For example, continuously described processes may be simultaneously or substantially simultaneously performed or may be performed in reverse. For example, when the enable signal DSG_en is received, after setting the resistance value of the resistor Ra to be different from that of the resistor Rb based on the target voltage gain, both the first channel 10a and the second channel 10b may be activated, which may also be applied to the activation of the dual slope gain mode described hereinafter.

Referring to FIGS. 2 and 6B, in an example embodiment, the 2-channel digital-to-analog converter 2 may receive the disable signal DSG_dis in operation S701. In some example embodiments, in operation S702, it may be determined whether both the first channel 10a and the second channel 10b are activated.

As described above, when the first ramp voltage OUT_1 is generated by the first output node 11a and the second ramp voltage OUT_2 is generated by the second output node 11b, that is, both the first channel 10a and the second channel 10b are activated, based on the target voltage gain to be obtained in operation S703, the resistance value of the resistor Ra of the first channel 10a may be set to be the same or substantially the same as that of the resistor Rb of the second channel 10b.

In operation S705, the first ramp voltage OUT_1 may be output through the first output node 11a of the first channel 10a, and the second ramp voltage OUT_2 may be output through the second output node 11b of the second channel 10b. As a result, when the first and second bias voltages VBP1 and VBP2 are respectively applied to the first and second channels 10a and 10b through the shared node BP Node, the magnitude of the first ramp voltage OUT_1 generated by the first channel 10a may be controlled to be the same or substantially the same as that of the second ramp voltage OUT_2 generated by the second channel 10b. That is, the same or substantially the same voltage gain may be obtained by the first channel 10a and the second channel 10b by deactivating the dual slope gain mode. In this case, by respectively outputting the first ramp voltage OUT_1 and the second ramp voltage OUT_2 having the same or substantially the same voltage gain from the first channel 10a and the second channel 10b, it is possible to increase a frame rate and to rapidly output the first ramp voltage OUT_1 and the second ramp voltage OUT_2. When only one of the first ramp voltage OUT_1 of the first channel 10a and the second ramp voltage OUT_2 of the second channel 10b is generated, that is, when only one of the first channel 10a and the second channel 10b is activated, in operation S706, the ramp voltage of only the activated channel may be output to the output node corresponding to the activated channel That is, a single voltage gain may be obtained by deactivating the dual slope gain mode.

In another example embodiment, although only one channel is activated, by activating the other channel and performing operations S703 and S705, the first channel 10a and the second channel 10b may obtain the same or substantially the same voltage gain, which may also be applied to deactivation of the dual slope gain mode described hereinafter.

However, the order in which the dual slope gain mode is deactivated is not limited to that of the current embodiment. When an example embodiment may be implemented differently, the dual slope gain mode may be activated in the order different from the described one. For example, continuously described processes may be simultaneously or substantially simultaneously performed or may be performed in reverse. For example, when the disable signal DSG_dis is received, after setting the resistance value of the resistor Ra to be the same or substantially the same as that of the resistor Rb based on the target voltage gain, it may be determined whether the first channel 10a and the second channel 10b are activated to output the first ramp voltage OUT_1 and the second ramp voltage OUT_2, which may also be applied to the deactivation of the dual slope gain mode described hereinafter.

In some example embodiments, in the 2-channel digital-to-analog converter 2, the number of first and second current cells 100a and 110a included in the first channel 10a may be different from the number of third and fourth current cells 100b and 110b included in the second channel 10b. Specifically, although the number of first and second current cells 100a and 110a included in the first channel 10a is different from the number of third and fourth current cells 100b and 110b included in the second channel 10b, because it may be determined whether each of the first to fourth current cells 100a, 110a, 100b, and 110b is used (e.g., whether a current is generated or is inhibited or prevented from being generated by each of the first to fourth current cells 100a, 110a, 100b, and 110b) by controlling the first to fourth switches 300a, 310a, 300b, and 310b, resolutions of the output voltages may be controlled. For example, in the case of a 10 bit-digital input, switches corresponding to 1,024 current cells among the first and second current cells 100a and 110a of the first channel 10a and 1,024 current cells among the third and fourth current cells 100b and 110b of the second channel 10b may be in on states to be used.

FIG. 7A is a block diagram illustrating an overall structure of a 3-channel or more multi-line digital-to-analog converter 3 according to an example embodiment.

As described above, the digital-to-analog converter 1 is not limited to the single channel digital-to-analog converter 1 or the 2-channel digital-to-analog converter 2 and may be the 3-channel or more multi-line digital-to-analog converter 3. In some example embodiments, as illustrated in FIG. 7A, the 3-channel or more multi-line digital-to-analog converter 3 may include N (e.g., N is a natural number equal to or greater than 3) different channels and each channel may include a plurality of current cells each generating a current. The plurality of current cells included in each channel may generate currents based on N bias voltages VBP1, VBP2, . . . , VBPm, . . . , and VBPn provided by bias circuits.

The 3-channel or more multi-line digital-to-analog converter 3 may include N different bias circuits 1000a, 1000b, . . . 1000_m . . . , and 1000_n. The N bias circuits 1000a, 1000b, . . . 1000_m . . . , and 1000_n may generate bias voltages VBP1, VBP2, . . . VBP_m . . . , and VBP_n, and may apply the bias voltages VBP1, VBP2, . . . VBP_m . . . , and VBP_n to N channels 10a, 10b, . . . 10_m . . . , and 10_n, respectively. Each of the bias voltages VBP1, VBP2, . . . VBP_m . . . , and VBP_n may be applied to the plurality of current cells included in each channel. The plurality of current cells included in each channel may commonly receive each of the bias voltages VBP1, VBP2, . . . VBP_m . . . , and VBP_n. In some example embodiments, each bias circuit may control each of the bias voltages VBP1, VBP2, . . . VBP_m . . . , and VBP_n based on external control so that magnitudes of currents generated by the plurality of current cells included in each of N channels 10a, 10b, . . . 10_m . . . , and 10_n may be controlled.

In some example embodiments, as illustrated in FIG. 7A, the N bias circuits 1000a, 1000b, . . . , 1000_m . . . , and 1000_n may be connected through a shared node BP Node_a. The N bias circuits 1000a, 1000b, . . . , 1000_m . . . , and 1000_n may set the shared node BP Node_a based on an Mth (e.g., M is a natural number equal to or less than N) bias circuit. Accordingly, each of the N channels 10a, 10b, . . . 10_m . . . , and 10_n may receive the same or substantially the same bias voltage VBP1, VBP2, . . . VBP_m . . . , or VBP_n through the shared node BP Node_a. Therefore, high linearity may be provided.

Specifically, by including the shared node BP Node_a, it is possible to inhibit or prevent mismatch between each two of the N channels 10a, 10b, . . . 10_m . . . , and 10_n from occurring and to reduce DNL deterioration. In addition, by including additional bias circuits to apply the bias voltages VBP1, VBP2, . . . VBP_m . . . , and VBP_n to the N channels 10a, 10b, . . . 10_m . . . , and 10_n through the shared node BP Node_a, it is possible to remarkably reduce the effect of coupling between each two of the N channels 10a, 10b, . . . 10_m . . . , and 10_n and INL deterioration.

Hereinafter, because configurations of a selection circuit controlling current generation of each of the plurality of current cells that may be included in each of the N channels 10a, 10b, . . . 10_m . . . , and 10_n and a resistor connected to the selection circuit are previously described, detailed description thereof is not given.

In some example embodiments, each of the N channels 10a, 10b, . . . 10_m . . . , and 10_n may include a plurality of switches inhibiting or preventing currents from being generated by the plurality of current cells included in each channel and connected to ground. Because a method of controlling the current generation of each of the plurality of current cells through the plurality of switches is previously described, description thereof is not given.

In some example embodiments, each of the plurality of current cells included in each of the N channels 10a, 10b, ... 10_m ..., and 10_n may include a cascode structure. As described above, each of the plurality of current cells may include a first transistor and a second transistor, and the first transistor may receive each of the bias voltages VBP1, VBP2, ... VBP_m ..., and VBP_n from a bias circuit corresponding to a channel including the first transistor among the N bias circuits 1000a, 1000b, ... 1000_m ..., and 1000_n. The second transistor may receive a cascode voltage (for example, VCASP of FIG. 4A) from a bias circuit corresponding to a channel including the second transistor among the N bias circuits 1000a, 1000b, ..., 1000_m ..., and 1000_n.

As described above, outputs of the N channels 10a, 10b, ... 10_m ..., and 10_n may be output to N output nodes 11a, 11b, ... 11_m ..., and 11_n, respectively. In addition, the resistors included in the N channels 10a, 10b, ... 10_m ..., and 10_n as variable resistors may be set to have different resistance values. In this case, although the same bias voltage VBP1, VBP2, ... VBP_m ..., and VBP_n is applied to each channel through the shared node BP Node_a, voltage gains that are outputs obtained by the N output nodes 11a, 11b, ... 11_m ..., and 11_n may be controlled to be different from one another. As such, the dual slope gain mode, in which different voltage gains may be obtained, may be set.

In some example embodiments, as described above, the 3-channel or more multi-line digital-to-analog converter 3 may determine whether the dual slope gain mode is activated based on the dual slope gain mode signal, e.g., the enable signal DSG_en or the disable signal DSG_dis provided from the outside. However, the inventive concepts are not limited thereto. The dual slope gain mode signal, that is, the enable signal DSG_en or the disable signal DSG_dis, is not only provided from the outside. The dual slope gain mode signal, e.g., the enable signal DSG_en or the disable signal DSG_dis, may be provided by the 3-channel or more multi-line digital-to-analog converter 3.

In some example embodiments, when the 3-channel or more multi-line digital-to-analog converter 3 receives the activated enable signal DSG_en, at least one of the plurality of switches included in each of two or more channels among the N channels 10a, 10b, ... 10_m ..., and 10_n may be in an on state. In some example embodiments, a current generated by at least one current cell corresponding to the switch in the on state among the plurality of current cells of each channel may flow through the resistor. Accordingly, the output voltages may be generated by the output nodes. As a result, two or more channels may be activated in accordance with the activated enable signal DSG_en. In some example embodiments, as described above, when the resistance value of the resistor included in each of the two or more activated channels is set to vary based on the target voltage gain, although the same bias voltage VBP1, VBP2, ... VBP_m ..., or VBP_n is applied to the two or more activated channels through the shared node BP Node_a, different voltage gains may be obtained through an output node of each channel. In other words, the dual slope gain mode may be activated. Different voltage gains may be used separately.

In an example embodiment, when the deactivated dual slope gain mode signal, that is, the disable signal DSG_dis, is received, resistance values of activated channels among the N channels 10a, 10b, ... 10_m ..., and 10_n may be set to be the same or substantially the same based on the target voltage gain. In other words, by deactivating the dual slope gain mode, the same voltage gain may be obtained by the activated channels. In this case, it is possible to increase a frame rate and to rapidly output voltages.

In some embodiments, in the 3-channel or more multi-line digital-to-analog converter 3, the number of current cells included in each of the two or more channels among the N channels 10a, 10b, ... 10_m ..., and 10_n may vary. Specifically, although the number of current cells included in each of the N channels 10a, 10b, ... 10_m ..., and 10_n varies, because it may be determined whether each of the current cells is used (e.g., whether a current is generated or is inhibited or prevented from being generated by each of the current cells) by controlling the plurality of switches, resolutions of the output voltages may be controlled. For example, in the 10 bit-digital input, switches corresponding to 1,024 current cells of the plurality of current cells of each of the N channels 10a, 10b, ... 10_m ..., and 10_n may be used in on states.

Figure 7B:
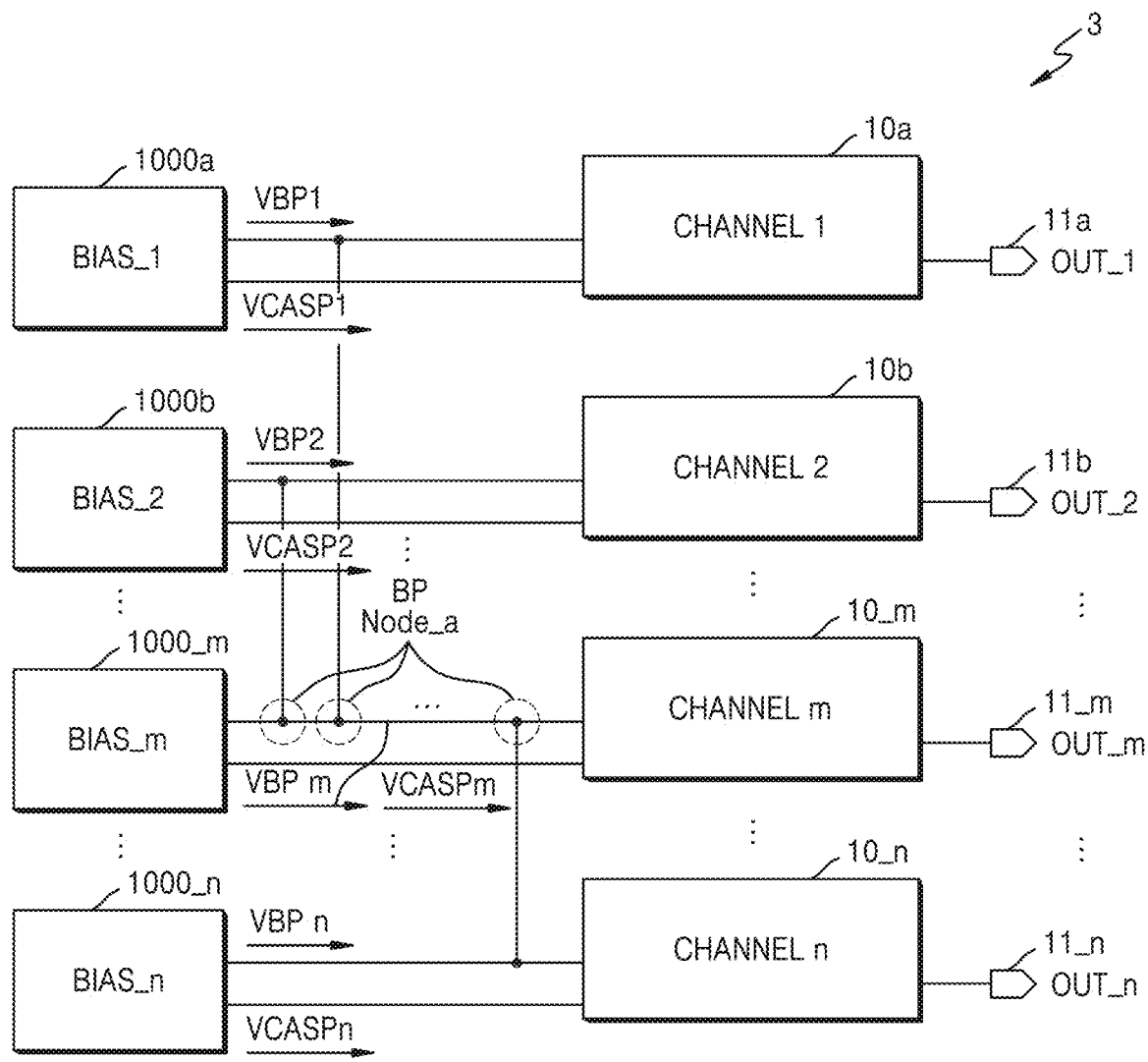
FIG. 7B is a block diagram illustrating an overall structure of a multi-line digital-to-analog converter in accordance with the structures of the plurality of current cells of FIG. 4A.

FIG. 7B is a block diagram illustrating an overall structure of a multi-line digital-to-analog converter in accordance with the structures of the plurality of current cells of FIG. 4A.

Referring to FIGS. 4A, 7A, and 7B, as described above, the plurality of current cells of each of the N channels 10a, 10b, ... 10_m ..., and 10_n of the 3-channel or more multi-line digital-to-analog converter 3 may have a cascode structure. In some example embodiments, the N bias circuits 1000a, 1000b, ... 1000_m ..., and 1000_n may be connected through the shared node BP Node_a. However, N cascode voltages VCASP1, VCASP2 ... VCASPm ..., and VCASPn received by the second transistor of each of the plurality of current cells of each of the N channels 10a, 10b, ... 10_m ..., and 10_n may be applied without an additional shared node.

Figure 8:
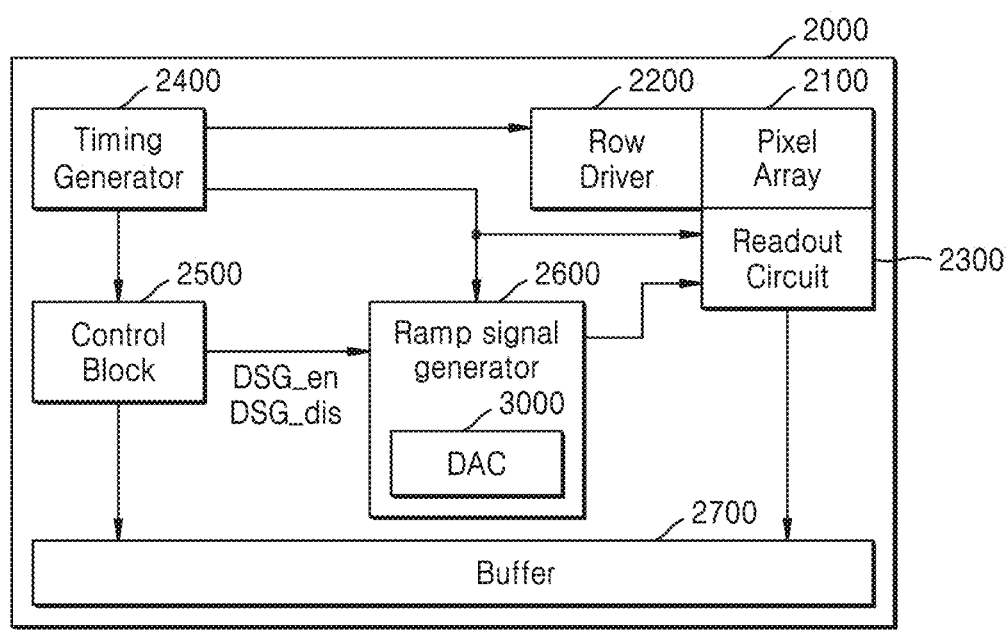
FIG. 8 is a block diagram of an image sensor system including a ramp signal generator including a digital-to-analog converter according to an example embodiment.

FIG. 8 is a block diagram of an image sensor system 2000 including a ramp signal generator 2600 including the digital-to-analog converter 1 according to an example embodiment.

Referring to FIG. 8, the image sensor 2000 may include a control register block 2500, a timing generator 2400, a row driver 2200, a pixel array 2100, a readout circuit 2300 including a column driver (not shown), the ramp signal generator 2600 including the digital-to-analog converter 1, and a buffer 2700.

The control register block 2500 may control the overall operation of the image sensor 2000. In particular, the control register block 2500 may directly transmit an operation signal to the timing generator 2400, the ramp signal generator 2600, and the buffer 2700. However, the inventive concepts are not limited thereto, and the control register block 2500 may be connected to other components.

For example, as described above, the control register block 2500 may transmit the enable signal DSG_en and the disable signal DSG_dis to the ramp signal generator 2600. However, the inventive concepts are not limited thereto. According to an example embodiment, the ramp signal generator 2600 may receive the enable signal DSG_en and the disable signal DSG_dis from another component of a logic circuit.

The timing generator 2400 may generate a signal serving as a reference for operation timings of various components of the image sensor 2000. The operation timing reference signal generated by the timing generator 2400 may be transmitted to the row driver 2200, the readout circuit 2300, and the ramp signal generator 2600.

Figure 11:
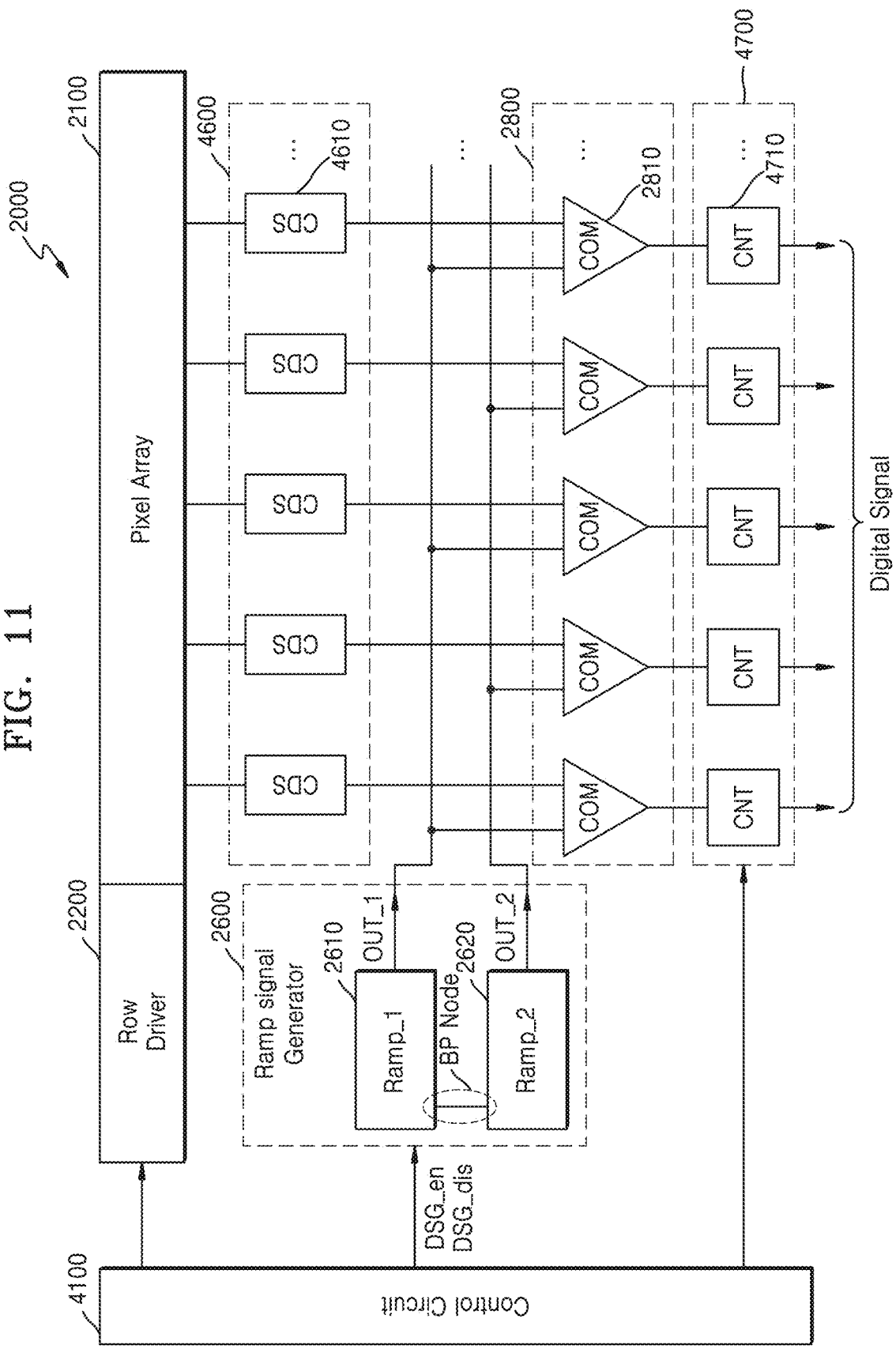
FIG. 11 is a diagram embodying the second region of FIG. 10 according to an example embodiment.

The ramp signal generator 2600 may generate and transmit a ramp voltage used by the readout circuit 2300. The ramp signal generator 2600 may include the digital-to-analog converter 1 as illustrated in FIG. 11, and the digital-to-analog converter 1 may include the single channel digital-to-analog converter 1, the 2-channel digital-to-analog converter 2, or the 3-channel or more multi-line digital-to-analog converter 3 as described above with reference to FIGS. 1 to 7B. The ramp signal generator 2600 may generate an output voltage of the digital-to-analog converter 1 according to the example embodiment as a signal. The ramp signal generator may include a digital-to-analog converter (DAC) 3000.

As described above with reference to FIG. 1, the ramp signal generator 2600 including the digital-to-analog converter 1 according to the example embodiment may determine whether each of the first and second current cells 100a and 110a is used and may control an on or off state of each of the first and second switches 300a and 310a respectively corresponding to the first and second current cells 100a and 110a in order to control the current generated by each of the first and second current cells 100a and 110a. Therefore, when a current of a current cell in use is to be blocked (or when an unused current cell is to be used), because the current may be blocked (or may be generated) through switching of the switch, the effect of noise and a settling time may be reduced, compared to directly switching each node. In addition, by controlling the current generated by each of the first and second current cells 100a and 110a to flow through the resistor Ra or the reference voltage (for example, the ground), a magnitude of the current flowing through the resistor Ra may be controlled. Therefore, the magnitude of the first ramp voltage OUT_1 output through the first output node 11a may be controlled.

In addition, in a comparative example in which the bias node 400a connecting the first bias circuit 1000a to the first channel 10a is directly switched in order to control current generation of each of the current cells, it may be requested to charge a capacitor in order to settle the first bias circuit 1000a against a rapid voltage change while switching the bias node 400a. On the other hand, according to the inventive concepts, because the current generation is controlled by switching the first and second switches 300a and 310a in a state in which the bias node 400a is connected, a charging state of the capacitor may be maintained and a settling time may be remarkably reduced.

As described above with reference to FIGS. 2 and 3, the ramp signal generator 2600 may include the first channel 10a generating the first ramp voltage OUT_1 and the second channel 10b generating the second ramp voltage OUT_2. The ramp signal generator 2600 may include the first bias circuit 1000a applying the first bias voltage VBP1 to the first channel 10a through the shared node BP Node and the second bias circuit 1000b applying the second bias voltage VBP2 to the second channel 10b through the shared node BP Node. As described above, high linearity may be provided through the shared node BP Node. Specifically, it is possible to remarkably reduce DNL deterioration and INL.

The first channel 10a may include the first and second current cells 100a and 110a respectively generating currents, the first and second selection circuits 200a and 210a controlling the current generation of each of the first and second current cells 100a and 110a, the resistor Ra connected to the first and second current cells 100a and 110a to output the first ramp voltage OUT_1, and the first and second switches 300a and 310a connecting the first and second current cells 100a and 110a to the ground to determine whether the currents are generated by the first and second current cells 100a and 110a. Because the configuration of the second channel 10b is previously described, description thereof is not given.

For example, as described below, the readout circuit 2300 may include a correlated double sampling (CDS) circuit 4600 (refer to FIG. 11) and a comparison unit 2800 (refer to FIG. 11) and the ramp signal generator 2600 may generate and transmit the ramp voltage used by the comparison unit 2800 (refer to FIG. 11).

The buffer 2700 may include, for example, a latch. The buffer 2700 may temporarily store an image signal to be provided to the outside and may transmit an image signal to external memory or an external device.

The pixel array 2100 may sense an external image. The pixel array 2100 may include a plurality of pixels (or unit pixels). The row driver 2200 may selectively activate a row of the pixel array 2100.

After the readout circuit 2300 samples a pixel signal received from the pixel array 2100 through the CDS circuit 4600 (refer to FIG. 11) and the comparison unit 2800 (refer to FIG. 11) compares the sampled pixel signal with the signal generated by the ramp signal generator 2600, an analog image signal (data) may be converted into a digital image signal (data) based on the comparison result. In addition, the readout circuit 2300 may include a column driver, and the column driver may include a latch and an amplification circuit capable of temporarily storing a digital signal and may process the digital signal generated by the readout circuit 2300.

Figure 9:
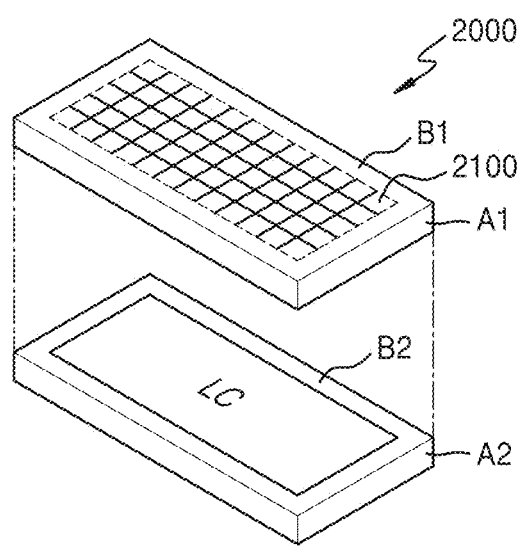
FIG. 9 is a view describing a conceptual layout of an image sensor according to an example embodiment.

FIG. 9 is a view describing a conceptual layout of the image sensor 2000 according to an example embodiment.

Referring to FIG. 9, the image sensor 2000 may include a first region A1 and a second region A2 stacked in a first direction (for example, a vertical direction). The first region A1 and the second region A2 may extend in second and third directions intersecting with the first direction as illustrated in FIG. 9 and the control register block 2500, the timing generator 2400, the row driver 2200, the pixel array 2100, the readout circuit 2300, the ramp signal generator 2600, and the buffer 2700 illustrated in FIG. 8 may be arranged in the first region A1 and the second region A2.

Although not shown, a third region in which memory is arranged may be arranged under the second region A2. At this time, the memory arranged in the third region may receive image data from the first region A1 and the second region A2, may store or process the image data, and may retransmit the image data to the first region A1 and the second region A2. In some example embodiments, the memory may include a memory device such as a dynamic random access memory (DRAM) device, a static random access memory (SRAM) device, a spin transfer torque magnetic random access memory (STT-MRAM) device, or a flash memory device. For example, when the memory includes the DRAM device, the memory may receive the image data at a high speed and may process the image data. In addition, in an example embodiment, the memory may be arranged in the second region A2.

The first region A1 may include the pixel array 2100 and a first peripheral region B1, and the second region A2 may include a logic circuit region LC and a second peripheral region B2. The first region A1 and the second region A2 may be sequentially stacked up and down. However, the inventive concepts are not limited thereto.

In the first region A1, the pixel array 2100 may be the same as the pixel array 2100 described with reference to FIG. 8. The pixel array 2100 may include a plurality of unit pixels arranged in a plurality of columns and a plurality of rows. Each of the plurality of unit pixels may include a photo diode and transistors.

The first peripheral region B1 may include a plurality of pads and may be arranged around the pixel array 2100. The plurality of pads may transmit and receive an electrical signal to and from an external device.

In the second region A2, the logic circuit region LC may include electronic devices including a plurality of transistors. The electronic devices included in the logic circuit region LC may be electrically connected to the pixel array 2100 to provide a constant signal to each of the plurality of unit pixels of the pixel array 2100 or to control an output signal.

In the logic circuit region LC, for example, the control register block 2500, the timing generator 2400, the row driver 2200, the readout circuit 2300, the ramp signal generator 2600, and the buffer 2700 described with reference to FIG. 8 may be arranged. However, the inventive concepts are not limited thereto. In the logic circuit region LC, for example, the control register block 2500, the timing generator 2400, the row driver 2200, the readout circuit 2300, the ramp signal generator 2600, and the buffer 2700 of FIG. 8 may be arranged.

In the second region A2, the second peripheral region B2 may be arranged to correspond to the first peripheral region B1 of the first region A1. However, the inventive concepts are not limited thereto.

Figure 10:
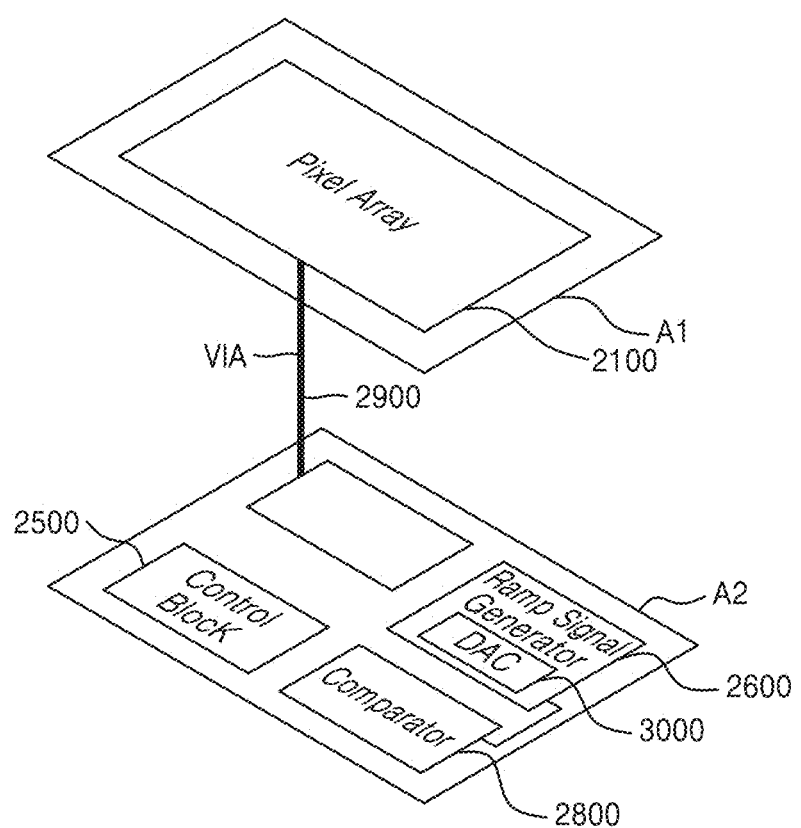
FIG. 10 is a diagram embodying a layout of the image sensor of FIG. 9 according to an example embodiment.

FIGS. 10 and 11 are diagrams embodying a layout of the image sensor 2000 of FIG. 9 according to an example embodiment.

Referring to FIG. 10, as described above, the second region A2 may include the ramp signal generator 2600 including the digital-to-analog converter 1 and the comparison unit 2800.

The control register block 2500 may control devices included in the first region A1 and the second region A2. The first region A1 and the second region A2 may be connected through a via 2900.

The ramp voltage output from the digital-to-analog converter 1 of the ramp signal generator 2600 may be transmitted to the comparison unit 2800.

Referring to FIGS. 8 to 11, in some example embodiments, the image sensor 2000 may include a control circuit 4100, the row driver 2200, the pixel array 2100, the ramp signal generator 2600, the CDS circuit 4600, the comparison unit 2800, and a counter 4700. The row driver 2200 may include an address decoder. In a video equipment field, a charge coupled device (CCD) or complementary metal-oxide-semiconductor (CMOS) image sensor detecting incident light as a physical quantity is used as an imaging device, and the image sensor 2000 of FIG. 11 may include the CCD image sensor or the CMOS image sensor.

The control circuit 4100 may include the timing generator 2400 and the control register block 2500 of FIG. 8. As described with reference to FIG. 8, the control circuit 4100 may control the overall operation of the image sensor 2000 and may generate a signal serving as a reference for operation timings of various components of the image sensor 2000.

The pixel array 2100 includes a plurality of pixels arranged to convert the incident light into an electrical analog signal by a unit component (for example, a unit pixel) and to output the electrical analog signal. The row driver 2200 may selectively activate a row of the pixel array 2100 in accordance with control of the control circuit 4100.

Analog pixel signals read from the pixel array 2100 are commonly output in units of columns and is processed. For this purpose, the CDS circuit 4600, the comparison unit 2800, and the counter 4700 may include a plurality of CDS circuits 4610 in units of columns, first to nth comparators 2810, and a plurality of counters 4710, respectively. Pixel signals may be simultaneously processed in parallel by using a plurality of signal processing units in units of columns so that the image sensor 2000 may operate at a high speed with improved band performance and reduced noise.

The electrical analog signals output from the pixel array 2100 have deviations caused by a difference in characteristics of each pixel and/or a difference in characteristics of logic for outputting a voltage signal from a pixel, it is desired or necessary to extract a valid signal component by obtaining a difference between a signal voltage in accordance with a reset component and a signal voltage in accordance with a signal component. In some example embodiments, obtaining the reset component and the signal component (e.g., an image signal component) when the pixel is initialized and extracting a difference between the reset component and the signal component is referred to as CDS that may be performed by the plurality of CDS circuits 4610.

The comparison unit 2800 uses the first to nth comparators 2810 as described below, using the analog voltage and lamp signal generator 2600 output from the column unit from the plurality of correlated double sampling circuits 4610 By comparing, comparative signals having each fabric point according to the valid signal component can be output in column units.

The counter 4700 may count clocks by using the plurality of counters 4710 in accordance with the control of the control circuit 4100 and may output digital signals corresponding to the counted clocks in units of columns. The output digital signals may be transmitted to, for example, a latch, a buffer, or a signal transmission circuit.

The ramp signal generator 2600 may include a first ramp signal generator 2610 and a second ramp signal generator 2620. As described above, the first ramp signal generator 2610 may include the first channel 10a and the first bias circuit 1000a, and may output the first ramp voltage OUT_1. The second ramp signal generator 2620 may include the second channel 10b and the second bias circuit 1000b, and may output the second ramp voltage OUT_2. The first ramp signal generator 2610 may be connected to the second ramp signal generator 2620 through the shared node BP Node.

The first and second ramp voltages OUT_1 and OUT_2 of the ramp signal generator 2600 may be connected to the comparison unit 2800. Each of the first to nth comparators 2810 included in the comparison unit 2800 may receive the first ramp voltage OUT_1 or the second ramp voltage OUT_2 corresponding thereto as an input. For example, the comparison unit 2800 may include a first comparison unit receiving the first ramp voltage OUT_1 as an input and a second comparison unit receiving the second ramp voltage OUT_2 as an input.

In an example embodiment, as illustrated in FIG. 11, each of odd comparators such as a first comparator, a third comparator, . . . (for example, the first comparison unit) may receive the first ramp voltage OUT_1 output from the first ramp signal generator 2610 as an input. Each of even comparators such as a second comparator, a fourth comparator, . . . (for example, the second comparison unit) may receive the second ramp voltage OUT_2 output from the second ramp signal generator 2620 as an input. However, a method in which the first ramp voltage OUT_1 and the second ramp voltage OUT_2 are input to the comparison unit 2800 is not limited thereto. For example, the even comparators such as the second comparator, the fourth comparator, . . . may receive the first ramp voltage OUT_1 as the input and the odd comparators such as the first comparator, the third comparator, . . . may receive the second ramp voltage OUT_2 as the input. In another embodiment, among the n comparators, each of the first comparator, the second comparator, . . . , and the mth comparator may receive the first ramp voltage OUT_1 as the input and each of the (m+1)th comparator, . . . , and the nth comparator may receive the second ramp voltage OUT_2 as the input. That is, when the first ramp voltage OUT_1 and the second ramp voltage OUT_2 are input to the comparison unit 2800, a method in which the n comparators are distributed to correspond to the first ramp voltage OUT_1 and the second ramp voltage OUT_2 may vary.

As a result, the image sensor 2000 may connect the first ramp voltage OUT_1 and the second ramp voltage OUT_2 that are output voltages of the ramp signal generator 2600 to the first to nth comparators 2810 of the comparison unit 2800 corresponding to the first ramp voltage OUT_1 and the second ramp voltage OUT_2 and may separately process the first ramp voltage OUT_1 and the second ramp voltage OUT_2.

Referring to FIGS. 2 and 11, in embodiments, the resistor Ra of the first ramp signal generator 2610 and the resistor Rb of the second ramp signal generator 2620 may be variable resistors.

In an example embodiment, the ramp signal generator 2600 may activate or deactivate the dual slope gain mode based on the activated or deactivated dual slope gain mode signal provided from the outside (for example, the control circuit 4100), that is, the enable signal DSG_en or the disable signal DSG_dis. However, the inventive concepts are not limited thereto ?? the enable signal DSG_en or the disable signal DSG_dis is provided from the outside. The enable signal DSG_en or the disable signal DSG_dis activating or deactivating the dual slope gain mode may be provided by the ramp signal generator 2600.

When the ramp signal generator 2600 receives the activated dual slope gain mode signal, that is, the enable signal DSG_en, the first ramp voltage OUT_1 may be generated by the first ramp signal generator 2610 and the second ramp voltage OUT_2 may be generated by the second ramp signal generator 2620. That is, in accordance with the enable signal, both the first channel 10a of the first ramp signal generator 2610 and the second channel 10b of the second ramp signal generator 2620 may be activated.

Based on the target voltage gain to be obtained through the dual slope gain mode, the resistor Ra of the first ramp signal generator 2610 may be set to be different from the resistor Rb of the second ramp signal generator 2620.

In some example embodiments, by respectively outputting the first ramp voltage OUT_1 and the second ramp voltage OUT_2 from the first ramp signal generator 2610 and the second ramp signal generator 2620, the magnitude of the first ramp voltage OUT_1 may be controlled to be different from that of the second ramp voltage OUT_2. That is, the dual slope gain mode in which different voltage gains may be obtained by the first ramp signal generator 2610 and the second ramp signal generator 2620 may be activated. The first and second ramp voltages OUT_1 and OUT_2 having different voltage gains may be used separately.

In addition, referring to FIGS. 2 and 11, in an example embodiment, when the ramp signal generator 2610 receives the deactivated dual slope gain mode signal, that is, the disable signal DSG_dis, it may be determined whether both the first channel 10a of the first ramp signal generator 2610 and the second channel 10b of the second ramp signal generator 2620 are activated.

When both the first channel 10a and the second channel 10b are activated, based on the target voltage gain to be obtained, the resistance value of the resistor Ra of the first channel 10a may be set to be the same as that of the resistor Rb of the second channel 10b.

In some example embodiments, by respectively outputting the first ramp voltage OUT_1 and the second ramp voltage OUT_2 from the first ramp signal generator 2610 and the second ramp signal generator 2620, the magnitude of the first ramp voltage OUT_1 may be controlled to be the same as that of the second ramp voltage OUT_2. That is, the same voltage gain may be obtained by the first ramp signal generator 2610 and the second ramp signal generator 2620 by deactivating the dual slope gain mode. In some example embodiments, by respectively outputting the first ramp voltage OUT_1 and the second ramp voltage OUT_2 having the same voltage gain from the first ramp signal generator 2610 and the second ramp signal generator 2620, it is possible to increase a frame rate and to rapidly output the first ramp voltage OUT_1 and the second ramp voltage OUT_2.

When only one of the first channel 10a of the first ramp signal generator 2610 and the second channel 10b of the second ramp signal generator 2620 is activated, only the ramp voltage of the activated channel may be output to an output node corresponding to the activated channel. As a result, a single voltage gain may be obtained by deactivating the dual slope gain mode. In another example embodiment, as described above, although only the channel included in one ramp signal generator is activated, by activating the channel of the other ramp signal generator, the same voltage gain may be obtained by the first ramp signal generator 2610 and the second ramp signal generator 2620.

In some example embodiments, the ramp signal generator 2600 may have the number of first and second current cells 100a and 110a included in the first channel 10a of the first ramp signal generator 2610 different from the number of third and fourth current cells 100b and 110b included in the second channel 10b of the second ramp signal generator 2620. Specifically, although the number of current cells included in the first channel 10a of the first ramp signal generator 2610 is different from the number of current cells included in the second channel 10b of the second ramp signal generator 2620, because it may be determined whether each of the current cells is used (e.g., whether a current is generated or is inhibited or prevented from being generated by each of the current cells) by controlling the first to fourth switches 300a, 310a, 300b, and 310b, resolutions of the output voltages may be controlled. For example, in the case of a 10 bit-digital input, switches corresponding to 1,024 current cells among the first and second current cells 100a and 110a of the first channel 10a and 1,024 current cells among the third and fourth current cells 100b and 110b of the second channel 10b may be in on states to be used.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC),

What is claimed is:

1. A digital-to-analog converter comprising:
a first channel configured to output a first ramp voltage through an output node; and
a first bias circuit configured to apply a bias voltage to the first channel,
wherein the first channel comprises
a plurality of current cells connected to the first bias circuit,
a plurality of selection circuits and a plurality of switches, each of the plurality of switches corresponding to a different one of the plurality of current cells, and
a first resistor connected to the output node to generate the first ramp voltage in accordance with a current generated by each of the plurality of current cells,
wherein each of the plurality of selection circuits of the first channel comprises
a first selection transistor configured to connect a current of one current cell of the plurality of current cells to the first resistor in accordance with a first digital input signal, and
a second selection transistor configured to connect the current of the one current cell to one of the plurality of switches corresponding to the one current cell in accordance with a second digital input signal complementary to the first digital input signal, wherein the one of the plurality of switches is configured to connect the second selection transistor to a reference voltage in accordance with a switching signal.

2. The digital-to-analog converter of claim 1, further comprising:
a second channel configured to output a second ramp voltage through the output node; and
a second bias circuit configured to apply a bias voltage to the second channel,
wherein the second channel comprises
a plurality of current cells connected to the second bias circuit,
a plurality of selection circuits and a plurality of switches, each of the plurality of switches of the second channel corresponding to a different one of the plurality of current cells of the second channel; and
a second resistor connected to the output node to generate the second ramp voltage in accordance with a current generated by each of the plurality of current cells of the second channel,
wherein each of the plurality of selection circuits of the second channel comprises
a third selection transistor configured to connect a current of one current cell of the plurality of current cells of the second channel to the second resistor in accordance with a first digital input signal of the second channel; and
a fourth selection transistor configured to connect the current of the one current cell of the second channel to one of the plurality of switches of the second channel corresponding to the one current cell of the second channel in accordance with a second digital input signal of the second channel complementary to the first digital input signal of the second channel, wherein the one of the plurality of switches of the second channel is configured to connect the fourth selection transistor of the second channel to a reference voltage of the second channel in accordance with a switching signal of the second channel, and
wherein the first bias circuit is connected to the second bias circuit through a shared node.

3. The digital-to-analog converter of claim 1, wherein
each of the plurality of current cells includes a first transistor and a second transistor each having a cascode structure,
the first transistor is configured to receive the bias voltage from the first bias circuit, and
the second transistor is configured to receive a cascode voltage from the first bias circuit.

4. The digital-to-analog converter of claim 1, wherein each of the plurality of current cells includes one transistor configured to receive the bias voltage.

5. The digital-to-analog converter of claim 1, wherein the plurality of current cells are arranged in a plurality of rows and a plurality of columns.

6. The digital-to-analog converter of claim 2, wherein
the output node is a first output node,
the first channel is configured to output the first ramp voltage through the first output node, and
the second channel is configured to output the second ramp voltage through a second output node that is different from the first output node.

7. The digital-to-analog converter of claim 2, wherein, when an activated dual slope gain mode signal is received, at least one of the plurality of switches of the first channel is in an on state and at least one of the plurality of switches of the second channel is in an on state.

8. The digital-to-analog converter of claim 7, wherein a resistance value of the first resistor is different from a resistance value of the second resistor.

9. The digital-to-analog converter of claim 2, wherein,
in accordance with a deactivated dual slope gain mode signal, when at least one of the plurality of switches of the first channel is in an on state and at least one of the plurality of switches of the second channel is in an on state, based on a target voltage gain, a resistance value of the first resistor is configured to be the same as a resistance value of the second resistor, and
when the plurality of switches included in one of the first channel and the second channel are all in off states, the ramp voltage of an other one of the first channel and the second channel is output.

10. The digital-to-analog converter of claim 2, wherein a number of current cells included in the first channel is different from a number of current cells included in the second channel.

11. A digital-to-analog converter comprising:
N channels each configured to generate a ramp voltage, wherein N is a natural number greater than one; and
N bias circuits each configured to generate a bias voltage, and to apply the bias voltage to a corresponding channel among the N channels,
wherein each of the N channels comprises
a plurality of current cells each connected to a corresponding one of the N bias circuits,
a plurality of switch circuits each corresponding to a different one of the plurality of current cells, and a resistor connected to the plurality of switch circuits,
wherein each of the plurality of switch circuits of each of the N channels comprises
a first selection switch configured to connect a current of one current cell of the plurality of current cells to the resistor based on a first digital input, and
a second selection switch configured to connect the current of the one current cell to a reference voltage based on a second digital input complementary to the first digital input, and
wherein the N bias circuits are connected to one another through a shared node.

12. The digital-to-analog converter of claim 11, wherein each of the N channels further comprises a plurality of enable switches, and each of the plurality of enable switches corresponds to a different one of the plurality of current cells, and
at least one of the plurality of enable switches corresponding to at least one of the plurality of current cells is configured to connect at least one second selection switch from the plurality of switch circuits to the reference voltage in accordance with a switching signal.

13. The digital-to-analog converter of claim 11, wherein each of the plurality of current cells comprises a first transistor and a second transistor each having a cascode structure,
the first transistor is configured to receive the bias voltage from the corresponding one of the N bias circuits, and
the second transistor is configured to receive a cascode voltage from the corresponding one of the N bias circuits.

14. The digital-to-analog converter of claim 11, wherein each of the N channels is configured to output the ramp voltage through a varying output node.

15. The digital-to-analog converter of claim 12, wherein, when an activated dual slope gain mode signal is received, at least one of the plurality of enable switches of each of two or more of the N channels is in an on state and, based on a target voltage gain, resistance values of the resistor of the two or more of the N channels are configured to be different from each other.

16. The digital-to-analog converter of claim 11, wherein a number of current cells included in two or more of the N channels is different among the two or more of the N channels.

17. An image sensor comprising:
a ramp signal generator configured to generate a ramp voltage; and
a comparison circuit configured to receive the ramp voltage as an input,
wherein the ramp signal generator comprises
a first channel configured to generate a first ramp voltage,
a second channel configured to generate a second ramp voltage,
a first bias circuit configured to apply a bias voltage to the first channel, and
a second bias circuit configured to apply a bias voltage to the second channel,
wherein each of the first channel and the second channel comprises
a plurality of current cells connected to a corresponding one of the first bias circuit and the second bias circuit,
a plurality of selection circuits and a plurality of switches, each of the plurality of switches corresponding to a different one of the plurality of current cells, and
a resistor connected to the plurality of selection circuits,
wherein each of the plurality of selection circuits comprises
a first selection transistor configured to connect a current of one current cell of the plurality of current cells to the resistor in accordance with a first digital input signal, and
a second selection transistor configured to connect the current of the one current cell to one of the plurality of switches corresponding to the one current cell in accordance with a second digital input signal complementary to the first digital input signal,
wherein the one of the plurality of switches is configured to connect the second selection transistor to a reference voltage in accordance with a switching signal, and
wherein the first bias circuit is connected to the second bias circuit through a shared node.

18. The image sensor of claim 17, wherein the comparison circuit comprises a first comparison circuit configured to receive the first ramp voltage output from the first channel and a second comparison circuit configured to receive the second ramp voltage output from the second channel.

19. The image sensor of claim 17, wherein, when an activated dual slope gain mode signal is received, the ramp signal generator is configured to set at least one of the plurality of switches of the first channel in an on state, set at least one of the plurality of switches of the second channel in an on state, and configure a resistance value of the resistor of the first channel to be different from a resistance value of the resistor of the second channel, based on a target voltage gain.

20. The image sensor of claim 17, wherein a number of current cells included in the first channel is different from a number of current cells included in the second channel.

* * * * *